US009060429B2

(12) United States Patent
Nagaoka et al.

(10) Patent No.: US 9,060,429 B2
(45) Date of Patent: Jun. 16, 2015

(54) CIRCUIT BOARD, SUBSTRATE MODULE, AND DISPLAY DEVICE

(75) Inventors: Gen Nagaoka, Osaka (JP); Yasuhiro Hida, Osaka (JP); Hiroki Miyazaki, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 357 days.

(21) Appl. No.: 13/581,542

(22) PCT Filed: Nov. 2, 2010

(86) PCT No.: PCT/JP2010/069513
§ 371 (c)(1),
(2), (4) Date: Aug. 28, 2012

(87) PCT Pub. No.: WO2011/111264
PCT Pub. Date: Sep. 15, 2011

(65) Prior Publication Data
US 2012/0319980 A1    Dec. 20, 2012

(30) Foreign Application Priority Data

Mar. 12, 2010 (JP) ................. 2010-055510

(51) Int. Cl.
*G06F 3/041* (2006.01)
*H05K 1/02* (2006.01)
(Continued)

(52) U.S. Cl.
CPC .............. *H05K 1/0269* (2013.01); *H05K 3/323* (2013.01); *H05K 3/361* (2013.01);
(Continued)

(58) Field of Classification Search
CPC ........ G06F 3/041; H05K 1/00; H05K 1/0266; H05K 1/0269; H05K 1/11; H05K 1/115

USPC .......... 345/76, 87, 92, 173; 174/250; 361/749
See application file for complete search history.

(56) References Cited

U.S. PATENT DOCUMENTS 5,876,884 A * 3/1999 Maeda et al. ................... 430/22
5,949,502 A * 9/1999 Matsunaga et al. ............ 349/40
(Continued)

FOREIGN PATENT DOCUMENTS

| JP | 7-128675 | 5/1995 |
| JP | 2006-40978 | 2/2006 |

(Continued)

OTHER PUBLICATIONS

Search Report dated Dec. 7, 2010, directed to International Application No. PCT/JP2010/069513; 2 pages.

*Primary Examiner* — Joe H Cheng
(74) *Attorney, Agent, or Firm* — Morrison & Foerster LLP

(57) ABSTRACT

Provided is a circuit board in which visibility of an alignment mark is improved.
In a case of manufacturing a substrate module in which a touch panel (20) and an FPC (50) are electrically connected, an alignment mark in the FPC (50) is formed by an opaque metal film, so that visibility is high. Consequently, when an alignment mark (25) in the touch panel (20) is also formed by an opaque metal film, the visibility of the alignment mark (25) also becomes high. By performing alignment using the alignment marks having high visibility, alignment between the touch panel (20) and the FPC (50) can be performed easily with high precision. As a result, the yield of the substrate module increases and modification of an alignment apparatus used for alignment becomes unnecessary, so that the manufacturing cost of the substrate module can be decreased.

15 Claims, 16 Drawing Sheets

(51) Int. Cl.
*H05K 3/32* (2006.01)
*H05K 3/36* (2006.01)

(52) U.S. Cl.
CPC ............... *H05K 2201/0326* (2013.01); *H05K 2201/0338* (2013.01); *H05K 2201/0391* (2013.01); *H05K 2201/09918* (2013.01); *H05K 2203/166* (2013.01)

(56) References Cited

U.S. PATENT DOCUMENTS

| | | | | |
|---|---|---|---|---|
| 2002/0012096 | A1* | 1/2002 | Uchiyama | 349/187 |
| 2003/0053056 | A1* | 3/2003 | Ohazama | 356/401 |
| 2004/0036833 | A1* | 2/2004 | Monzen | 349/158 |
| 2005/0095740 | A1* | 5/2005 | Hirakata et al. | 438/29 |
| 2006/0166111 | A1* | 7/2006 | Umetsu et al. | 430/5 |
| 2006/0291179 | A1 | 12/2006 | Tanimori | |
| 2007/0040286 | A1* | 2/2007 | Liu et al. | 257/797 |
| 2008/0030666 | A1* | 2/2008 | Abe et al. | 349/150 |
| 2008/0074603 | A1* | 3/2008 | Imaoka | 349/152 |
| 2008/0074604 | A1* | 3/2008 | Yanagawa et al. | 349/153 |
| 2008/0225222 | A1* | 9/2008 | Ueda | 349/154 |
| 2009/0175019 | A1* | 7/2009 | Koyama et al. | 361/803 |
| 2009/0179846 | A1* | 7/2009 | Miyata et al. | 345/92 |
| 2009/0221107 | A1* | 9/2009 | Yamazaki et al. | 438/29 |
| 2009/0288680 | A1* | 11/2009 | Kaneko et al. | 134/4 |
| 2010/0097551 | A1* | 4/2010 | Yamagishi et al. | |
| 2012/0320290 | A1* | 12/2012 | Hida et al. | 349/12 |

FOREIGN PATENT DOCUMENTS

| | | |
|---|---|---|
| JP | 2007-273578 | 10/2007 |
| JP | 2007-5540 | 11/2007 |

* cited by examiner

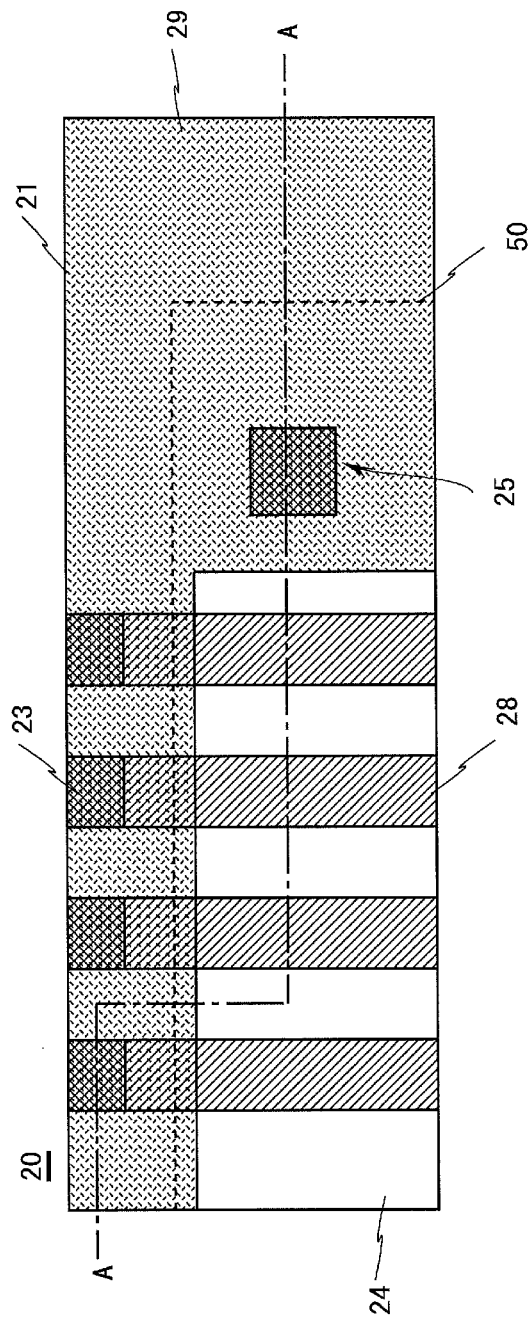
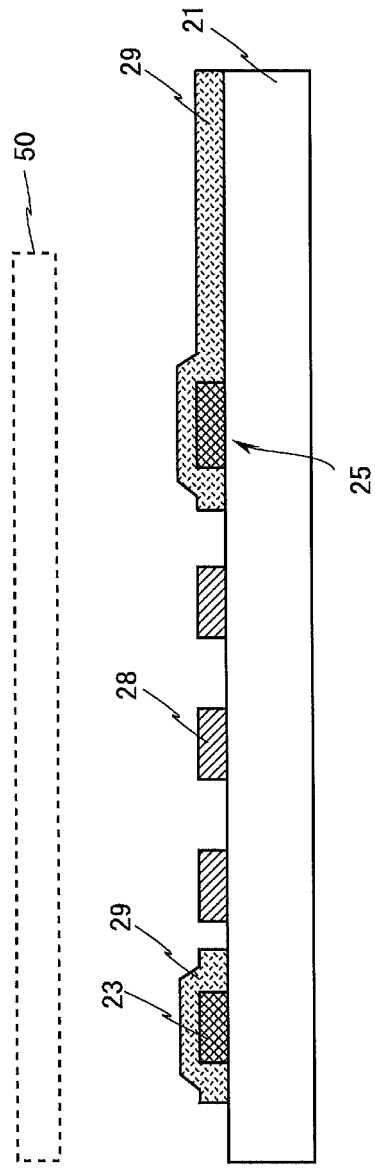
Fig. 3

Fig. 4
(a)
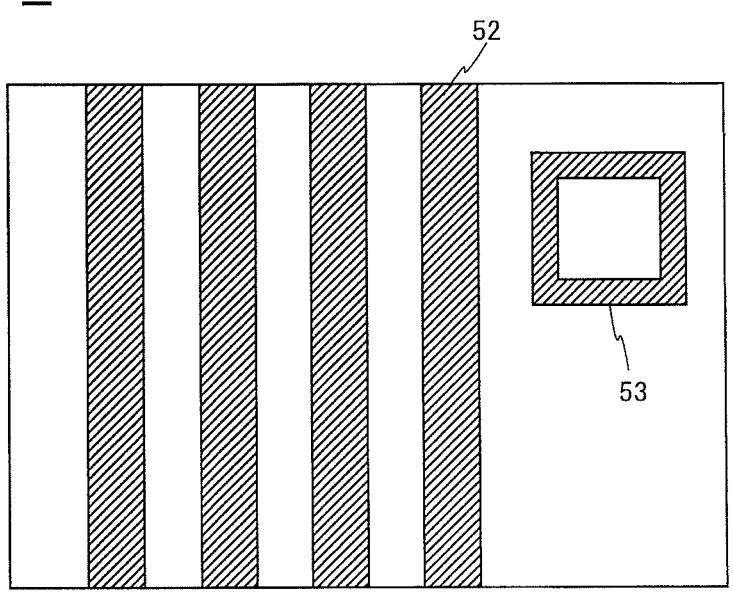
(b)
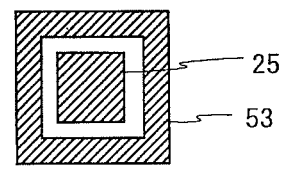

Fig. 7
(a) 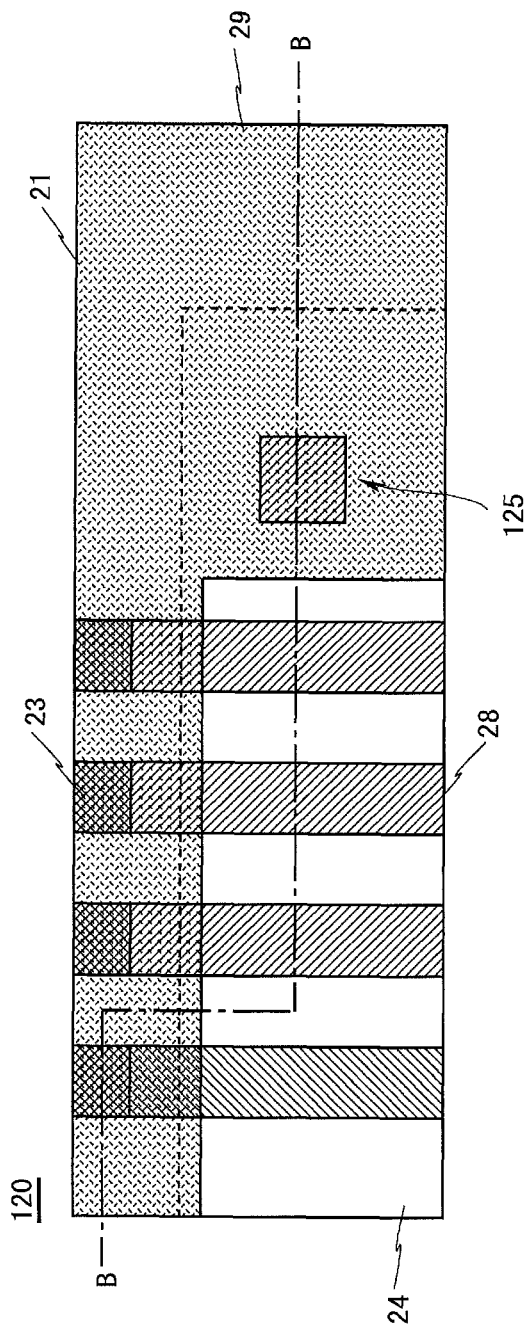
(b) 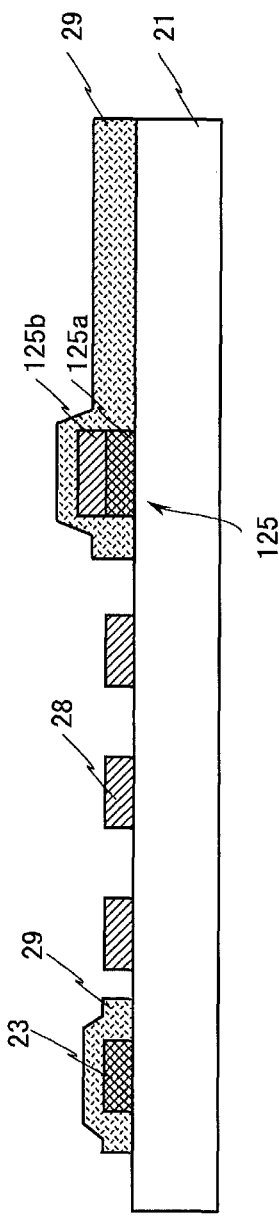

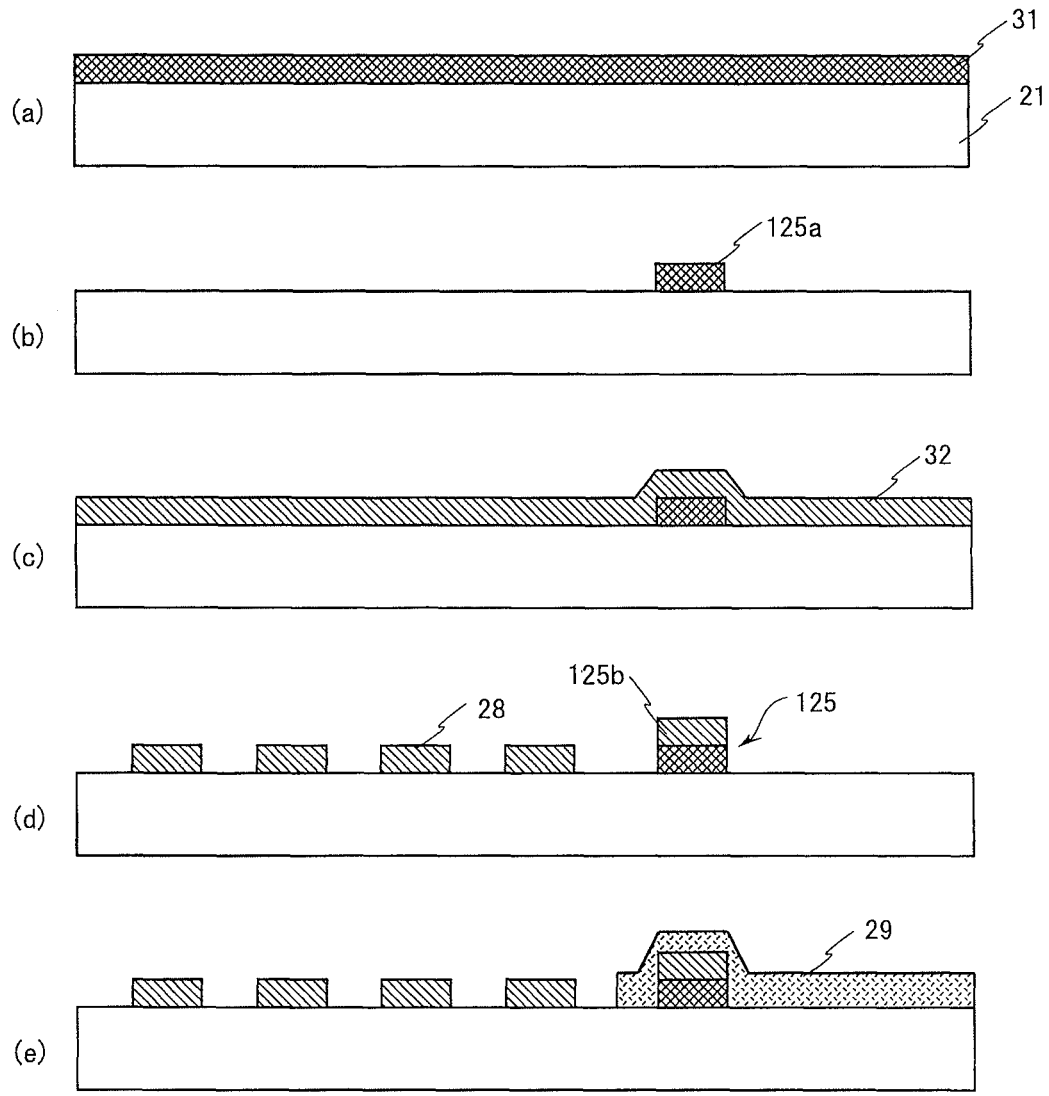
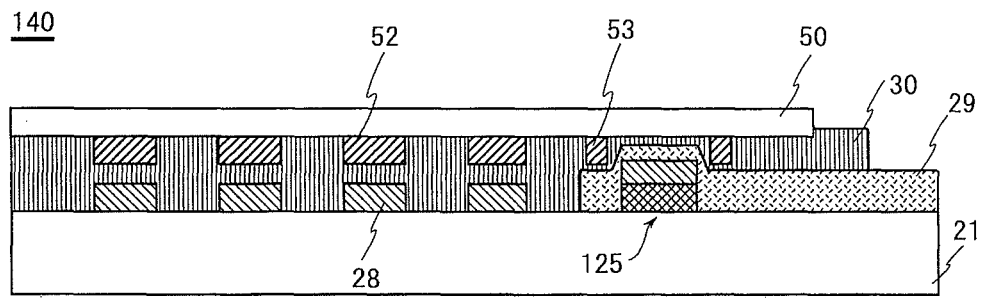

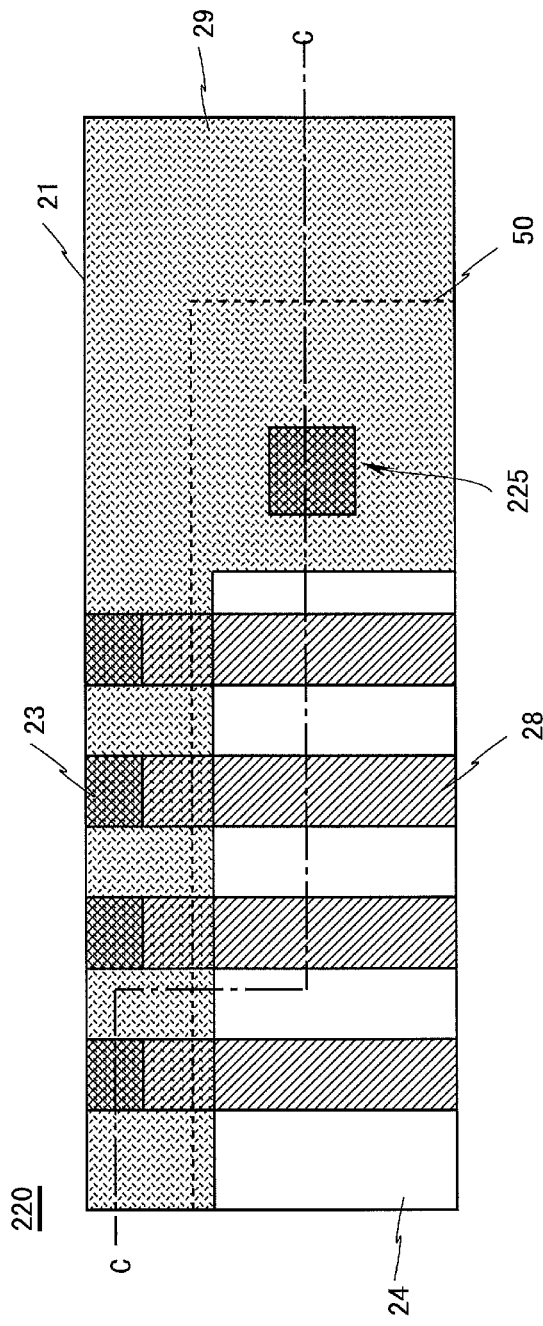
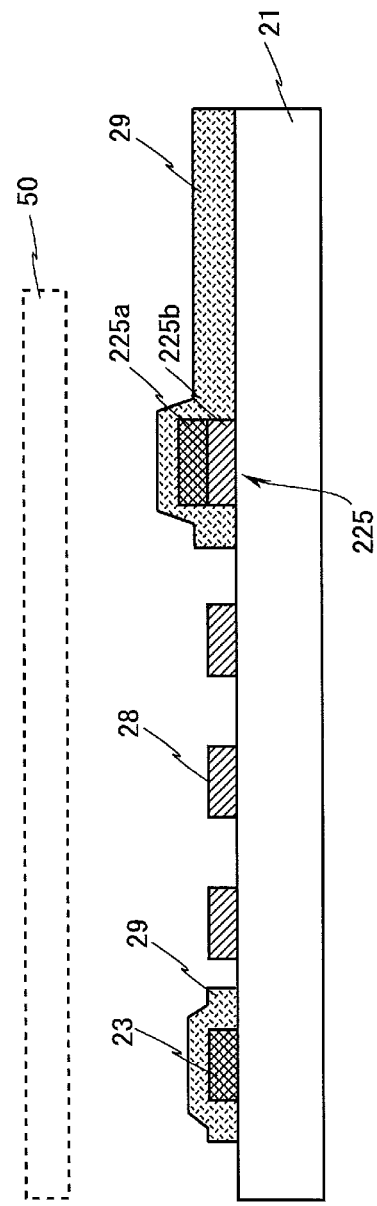
Fig. 10

Fig. 16 (a)
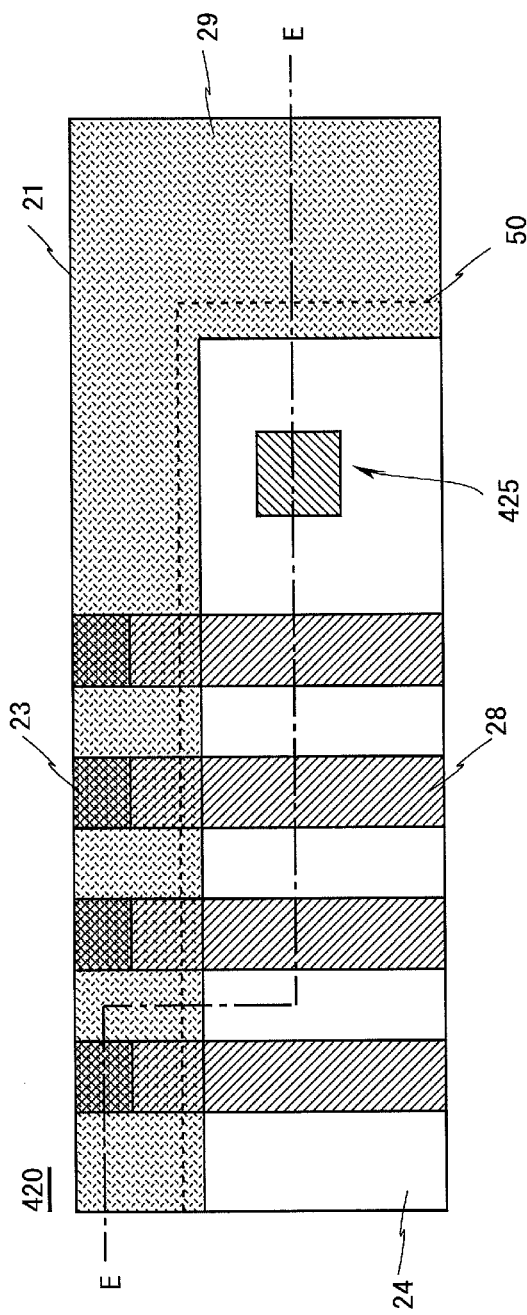
(b)
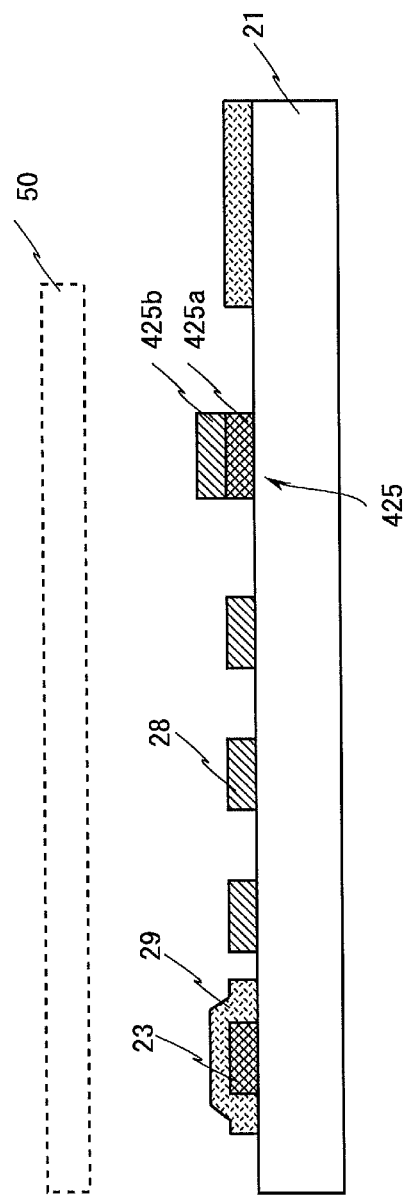

Fig. 19 (a) (b)

CIRCUIT BOARD, SUBSTRATE MODULE, AND DISPLAY DEVICE

REFERENCE TO RELATED APPLICATIONS

This application is a national stage application under 35 USC 371 of International Application No. PCT/JP2010/069513, filed Nov. 2, 2010, which claims the priority of Japanese Patent Application No. 2010-055510, filed Mar. 12, 2010, the entire contents of which are incorporated herein by reference.

FIELD OF THE INVENTION

The present invention relates to a circuit board, a substrate module, and a display device and, more particularly, to a circuit board, a substrate module, and a display device in which an alignment mark for connection to a flexible printed circuit is formed.

BACKGROUND OF THE INVENTION

Conventionally, as a connector for electrically connecting a circuit board such as a touch panel and an electronic part, a flexible printed circuit (hereinafter, called an "FPC") is used. The FPC is thermal-compression-bonded to a circuit board via an anisotropic conductive film (hereinafter, called an "ACF"). The circuit board and the FPC are aligned using alignment marks provided near connection regions so that they are not bonded in a state where connection terminals in the circuit board and connection terminals in the FPC are deviated from each other.

The alignment mark in the FPC is formed by copper foil which is the same as a wire in the FPC. Since copper is a metal having low light transmittance (hereinafter, called an "opaque metal"), visibility of the alignment mark formed by copper foil is high.

On the other hand, the alignment mark for the circuit board is often provided together with the connection terminal in a region from which a protective film on the board is removed. When the connection terminal is formed by an opaque metal film, the connection terminal absorbs moisture in air and becomes susceptible to corrosion. When the connection terminal is formed by a stacked film made of an indium tin oxide (hereinafter, called "ITO") film and an opaque metal film, the ITO film easily peels off in the interface with the opaque metal film. Thus, in the case where the connection terminal in the circuit board includes the opaque metal film, there is a problem such that reliability of the connection part between the FPC and the circuit board is not assured. When the connection terminal in the circuit board is formed only by the ITO film, the problem is solved. Further, when the alignment mark is also formed by the ITO film, positional deviation between the alignment mark and the connection terminal does not occur, so that alignment in the circuit board and the FPC can be performed with higher precision.

Japanese Patent Application Laid-Open No. Hei 7-128675 discloses a method of manufacturing a liquid crystal display device in which a transparent electrode in a display unit is less visible and a transparent electrode in a terminal part and an alignment mark are visible. The electrodes and the mark are formed by an ITO film on an insulating substrate. A soluble organic thin film is formed on the transparent electrode in the terminal part and on the alignment mark and, after that, the insulating substrate is thermally treated. Since oxidation in the transparent electrode in the display unit proceeds by thermal treatment, the transmittance of the transparent electrode in the display unit becomes higher as compared with that prior to the thermal treatment. However, the transparent electrode in the terminal part and the alignment mark are covered with the organic thin film, they are not oxidized by the thermal treatment. In such a manner, while maintaining the display quality of the display unit, the transparent electrode in the terminal part and the alignment mark are made visible.

[Patent Document 1] Japanese Patent Application Laid-Open No. Hei 7-128675

SUMMARY OF THE INVENTION

However, in the case of forming the alignment mark in the circuit board only by the ITO film, since the light transmittance of the ITO film is very high such as 80% or higher, at the time of aligning the FPC to the circuit board, the alignment mark in the circuit board becomes less visible. Consequently, at the time of manufacturing the substrate module in which the FPC is electrically connected to the circuit board, by performing alignment between the circuit board and the FPC using the alignment mark made only by the ITO film, misalignment tends to occur between the circuit board and the FPC, and the yield of the substrate module deteriorates. Meanwhile, when an alignment apparatus is modified so that the alignment mark made only by the ITO film is visible in order to improve the yield of the substrate module, the cost for the modification is necessary. Thus, when the alignment mark made only by the ITO film is used, the manufacturing cost of the circuit board and the substrate module using the same is high.

Further, in the case of controlling the transmittance of the ITO film by the method described in Japanese Patent Application Laid-Open No. Hei 7-128675, in addition to the thermal treatment process, a process of forming an organic thin film only in the terminal part is necessary prior to the thermal treatment process, and a process of peeling off the formed organic thin film is necessary after the thermal treatment process. As a result, the manufacturing cost of the liquid crystal display device becomes high. Furthermore, in the method described in Japanese Patent Application Laid-Open No. Hei 7-128675, the transmittance of the transparent electrode in the terminal part and the alignment mark does not change before and after the thermal treatment process. Therefore, even when the thermal treatment is performed on the insulating substrate by the method described in Japanese Patent Application Laid-Open No. Hei 7-128675, visibility of the alignment mark is not improved.

An object of the present invention is therefore to provide a circuit board with improved visibility of an alignment mark.

A first aspect of the present invention provides a circuit board having an insulating substrate, including:

a connection terminal formed on the insulating substrate and used for electric connection to a flexible printed circuit; and a first alignment mark used for alignment to the flexible printed circuit, wherein the connection terminal is formed by a transparent conductive film, and the first alignment mark includes a first mark formed by an opaque conductive film.

In accordance with a second aspect of the present invention, in the first aspect of the present invention, the first alignment mark is made only by a first mark formed by an opaque conductive film.

In accordance with a third aspect of the present invention, in the first aspect of the present invention, the first alignment mark further includes a second mark formed by a transparent conductive film, and the second mark is formed on an upper surface of the first mark.

In accordance with a fourth aspect of the present invention, in the first aspect of the present invention, the first alignment mark further includes a second mark formed by a transparent conductive film, and the first mark is formed on an upper surface of the second mark.

In accordance with a fifth aspect of the present invention, in the first aspect of the present invention, the circuit board further includes a first wire electrically connected to the connection terminal and formed by the opaque conductive film, and the first mark is formed by an opaque conductive film made of the same material as that of the first wire.

In accordance with a sixth aspect of the present invention, in the first aspect of the present invention, the first alignment mark is covered with a protective film.

In accordance with a seventh aspect of the present invention, in the first aspect of the present invention, the connection terminal in the circuit board is formed only by a transparent conductive film.

In accordance with an eighth aspect of the present invention provides a substrate module having the circuit board according to any one of the first to seventh aspects of the present invention and a flexible printed circuit electrically connected to the circuit board, wherein the flexible printed circuit includes:

a flexible substrate;

a second wire formed on the flexible substrate; and a second alignment mark formed near the second wire, and a connection terminal in the circuit board is electrically connected to the second wire aligned by using a first alignment mark in the circuit board and the second alignment mark in the flexible printed circuit.

In accordance with a ninth aspect of the present invention provides a display device having the circuit board according to any one of the first to seventh aspects of the present invention and a display panel displaying an image, wherein the circuit board is a touch panel formed by a transparent conductive film and further including a touch sensor for detecting a touched position, and the display panel is disposed so as to face the touch panel.

According to the first aspect of the present invention, the first alignment mark used for alignment to the flexible printed circuit is formed in the circuit board. The first mark included in the first alignment mark and formed by the opaque conductive film excellently reflects light used at the time of alignment. Consequently, visibility of the first alignment mark becomes high, and the position of the first alignment mark is detected easily with high precision. When such a first alignment mark is used, the flexible printed circuit and the circuit board can be aligned easily with high precision. Consequently, the circuit board and the flexible printed circuit can be electrically connected without causing misalignment.

According to any of the second to fourth aspects of the present invention, since the first alignment mark includes the first mark formed by the opaque conductive film, the same effect as that of the circuit board according to the first aspect is produced.

According to the fifth aspect of the present invention, since the first mark included in the first alignment mark is formed by the same opaque conductive film as that of the first wire, the first wire and the first mark can be simultaneously formed.

Therefore, the manufacturing process can be shortened, so that the manufacturing cost of the circuit board can be reduced.

According to the sixth aspect of the present invention, since the first alignment mark is covered with the protective film, the first mark included in the first alignment mark does not absorb moisture in air and is not corroded.

According to the seventh aspect of the present invention, the connection terminal in the circuit board is formed only by the transparent conductive film. Consequently, even when the connection terminal is not covered with the protective film, it is not corroded by moisture in air. Thus, reliability of the connection part with the flexible printed circuit can be assured.

According to the eighth aspect of the present invention, since visibility of the first alignment mark formed on the circuit board according to the first to seventh aspects is high, alignment with the second alignment mark formed in the flexible printed circuit is facilitated. Consequently, the flexible printed circuit can be aligned and connected to the circuit board easily with high precision.

According to the ninth aspect of the present invention, by using the circuit board according to the first to seventh aspects as the touch panel, the display device having the touch panel which is aligned and connected to the flexible printed circuit easily with high precision is obtained.

BRIEF DESCRIPTION OF THE DRAWINGS

FIG. 3(a) is a plan view showing a part of the touch panel included in the liquid crystal display device according to the first embodiment, and FIG. 3(b) is a cross sectional view of the touch panel taken along line A-A shown in FIG. 3(a).

FIG. 4(a) is a plan view showing a part of an FPC included in the liquid crystal display device according to the first embodiment, and FIG. 4(b) is a view showing the positional relation of alignment marks after alignment.

FIG. 7(a) is a plan view showing a part of a touch panel included in a liquid crystal display device according to a second embodiment, and FIG. 7(b) is a cross sectional view of the touch panel taken along line B-B shown in FIG. 7(a).

FIGS. 8(a) to 8(e) are process sectional views showing processes of manufacturing a touch panel included in the liquid crystal display device according to the second embodiment.

FIG. 9 is a cross sectional view showing the configuration of a substrate module obtained by thermal-compression-bonding an FPC to a touch panel included in the liquid crystal display device according to the second embodiment.

FIG. 10(a) is a plan view showing a part of a touch panel included in a liquid crystal display device according to a third embodiment, and FIG. 10(b) is a cross sectional view of the touch panel taken along line C-C shown in FIG. 10(a).

FIG. 16(a) is a plan view showing a part of a touch panel included in a liquid crystal display device according to a fifth embodiment, and FIG. 16(b) is a cross sectional view of the touch panel taken along line E-E shown in FIG. 16(a).

DETAILED DESCRIPTION OF THE INVENTION

1. First Embodiment 1.1 Configuration of Liquid Crystal Display Device

Figure 1:
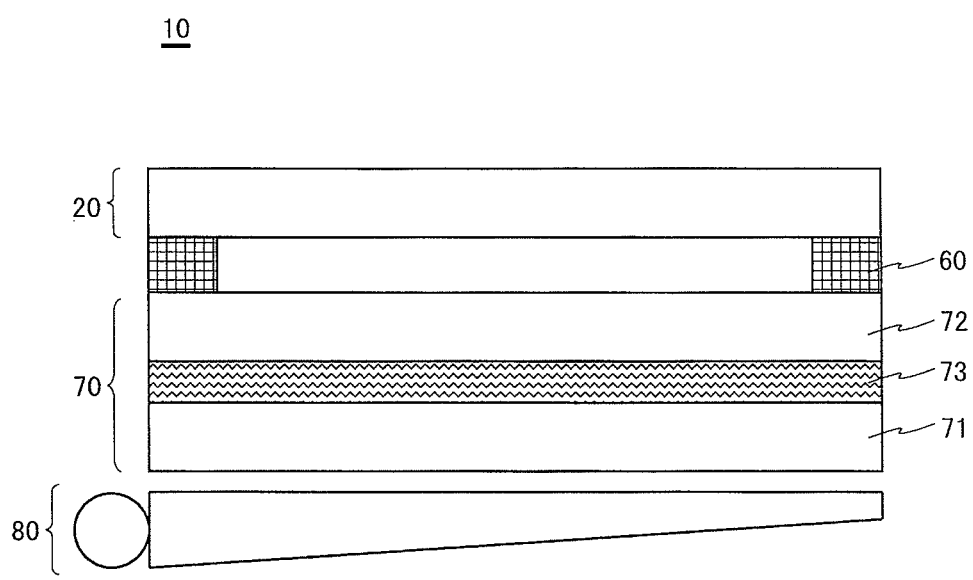
FIG. 1 is a cross sectional view showing the configuration of a liquid crystal display device according to a first embodiment of the present invention.

FIG. 1 is a cross sectional view showing a configuration of a liquid crystal display device 10 according to a first embodiment of the present invention. As shown in FIG. 1, the liquid crystal display device 10 includes a liquid crystal panel 70, a touch panel 20 fixed on an upper surface of the liquid crystal panel 70 by an adhesive member 60, and a backlight unit 80 provided on a lower surface of the liquid crystal panel 70.

A user of an electronic device having the liquid crystal display device 10 controls various functions of the electronic device by directly touching the touch panel 20 with his/her finger, a pen, or the like while visually recognizing information displayed on the liquid crystal panel 70 disposed on aback side of the touch panel 20. The liquid crystal panel 70 includes, as shown in FIG. 1, an active matrix substrate 71 and an opposed substrate 72 which are disposed so as to face each other and a liquid crystal layer 73 sandwiched between the substrates 71 and 72. The backlight unit 80 irradiates the liquid crystal panel 70 with light from a rear side.

Figure 2:
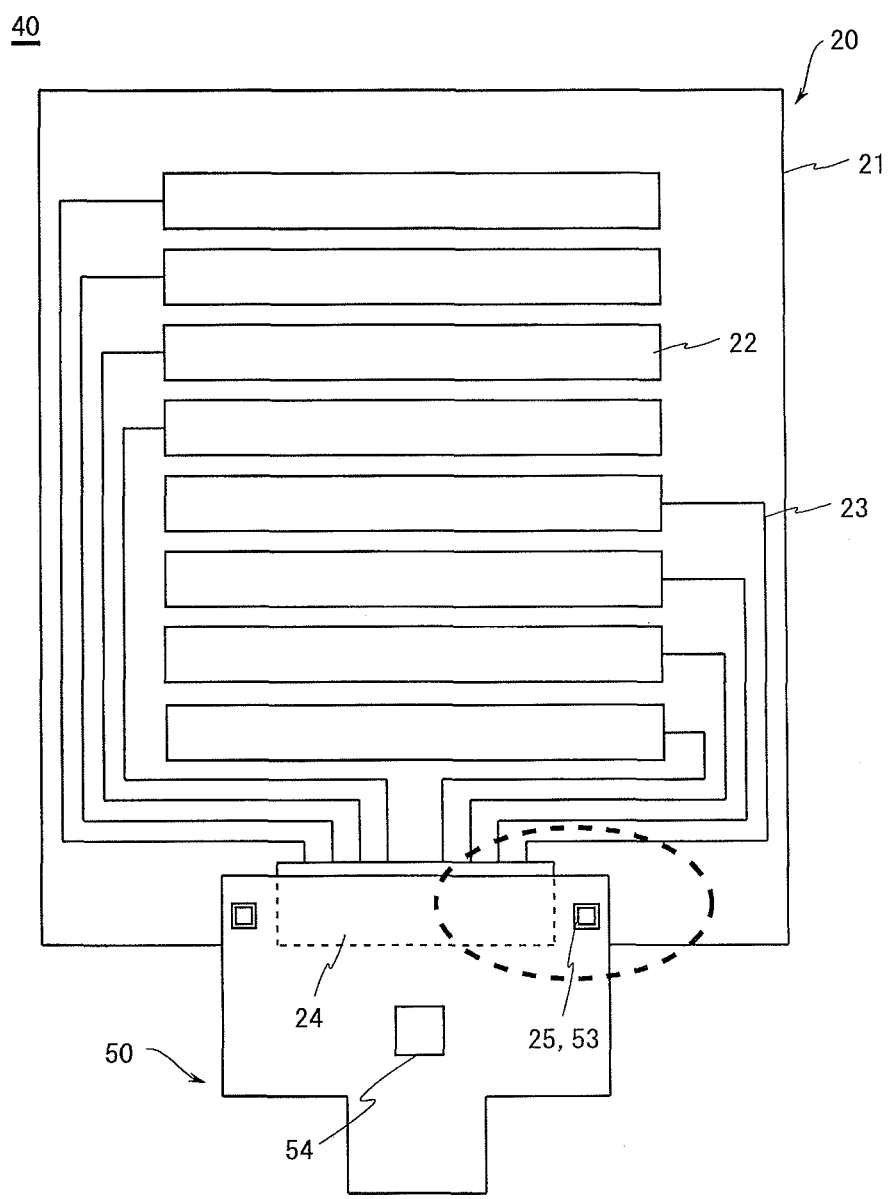
FIG. 2 is a plan view showing the configuration of a substrate module obtained by electrically connecting an FPC to a touch panel included in the liquid crystal display device according to the first embodiment.

FIG. 2 is a plan view showing a configuration of a substrate module 40 obtained by electrically connecting an FPC 50 to the touch panel 20 shown in FIG. 1. As shown in FIG. 2, the substrate module 40 includes the touch panel 20 and the FPC 50. The touch panel 20 includes an insulating substrate 21 such as a glass substrate, a plurality of touch sensors 22 formed on the insulating substrate, a plurality of lead wires 23, and a connection region 24 which is provided at an end of the insulating substrate 21 and in which a plurality of connection terminals (not shown) are formed.

The touch sensor 22 has a band shape, and the plurality of touch sensors 22 are disposed in parallel to one another. The touch sensors 22 are respectively connected to the plurality of connection terminals formed in the connection region 24 via the lead wires 23. Since the touch panel 20 is a touch panel of a capacitive coupling type, preferably, the touch sensor 22 has high resistance in order to increase precision of recognizing a touch position and is formed of a material having high transmittance so as not to decrease display quality of the liquid crystal panel 70. Consequently, the touch sensor 22 is formed by a transparent metal oxide film having transmittance of 80% or higher such as an ITO film or an indium zinc oxide (hereinafter, called "IZO") film.

Since the lead wire 23 has preferably low resistance, the lead wire 23 is formed by, for example, a metal film made of aluminum (Al), molybdenum (Mo), titanium nitride (TiN), or the like, or a stacked metal film obtained by stacking any of the metal films. Since the transmittance of the metal films is a few percent and is low, in the following description, the metal films may be called opaque metal films.

The connection terminals in the connection region 24 are formed only by the ITO film, and one end of the connection terminal is electrically connected to the lead wire 23. The touch sensors 22 and the lead wires 23 are covered with a protective film (not shown), and the connection region 24 including the connection terminals is not covered with a protective film.

The FPC 50 includes a flexible base film. On one of surfaces of the base film, a connection terminal (not shown) connected to a wire made of conductive foil having high conductivity such as copper foil is formed. On the other surface, an electronic part 54 such as a controller electrically connected to the wire via a through hole is mounted. The connection terminal in the FPC 50 is pressed against the connection terminal in the connection region 24 while being heated via an ACF (not shown) (thermal compression bonding) and is electrically connected to the connection terminal in the touch panel 20. The ACF is a kind of an anisotropic conductive adhesive material obtained by dispersion-mixing conductive particles having average particle diameter of about 5 μm in a thermoset binder resin such as epoxy resin, and is in a sheet shape. By pressing the FPC 50 against the touch panel 20 while heating the ACF, the connection terminal in the FPC 50 and the connection terminal in the touch panel 20 can be electrically connected to each other via the conductive particles included in the ACF.

An alignment mark 25 is formed on the outside of the connection region 24 in the touch panel 20, and an alignment marks 53 are formed on both ends of the FPC 50. The alignment marks 25 and 53 are used to align the touch panel 20 and the FPC 50. FIG. 3(a) is a plan view showing the alignment mark 25 and the connection region 24 in the touch panel 20, and is an enlarged view of a part (the region surrounded by a dotted line in an ellipse shape) in FIG. 2. FIG. 3(b) is a cross sectional view of the touch panel 20 taken along line A-A shown in FIG. 3(a). FIG. 4(a) is a plan view showing a part of wires (connection terminals) 52 and the alignment marks 53 in the FPC 50, and FIG. 4(b) is a view showing the positional relation of the alignment mark 25 in the touch panel 20 and the alignment mark 53 in the FPC 50 after alignment.

As shown in FIGS. 3(a) and 3(b), in the connection region 24 in the touch panel 20, the plurality of connection terminals 28 are formed so as to be parallel to one another. The connection terminals 28 are connected to the lead wires 23 formed by an opaque metal film made of aluminum or the like. On the right side of the connection region 24, the alignment mark 25 is formed. The alignment mark 25 is made only by a rectangular mark formed by the opaque metal film. A protective film 29 formed on the surface of the touch panel 20 covers the alignment mark 25 and the lead wires 23 and does not cover the connection terminals 28. Since FIGS. 3(a) and 3(b) show only a part of the touch panel 20, although not shown in FIGS. 3(a) and 3(b), the alignment mark 25 is formed also on the left side of the connection region 24. As shown in FIG. 3(b), the FPC 50 is disposed above the touch panel 20.

As shown in FIG. 4(a), the alignment mark 53 having a frame shape obtained by removing the opaque metal film into a rectangular shape in the center is formed on the FPC 50. Therefore, as shown in FIG. 4(b), by moving the FPC 50 so that the alignment mark 25 in the touch panel 20 is housed in the frame of the alignment mark 53 in the FPC 50, alignment of the touch panel 20 and the FPC 50 can be performed. The shapes of the alignment marks 25 and 53 shown in FIG. 4(b) are an example and other shapes may be employed.

1.2 Touch Panel Manufacturing Method

FIGS. 5(a) to 5(e) are process sectional views showing processes of manufacturing the touch panel 20. As shown in FIG. 5(a), on the insulating substrate 21 such as a glass substrate, for example, an aluminum film 31 is formed as the opaque metal film by a sputtering method. Next, as shown in FIG. 5(b), the aluminum film 31 is patterned by a photolithography method to form lead wires (not shown) and the alignment mark 25. By simultaneously forming the lead wires and the alignment mark in such a manner, the manufacturing process can be simplified.

As shown in FIG. 5(c), for example, an ITO film 32 is formed as a transparent metal oxide film so as to cover the entire insulating substrate 21. Next, as shown in FIG. 5(d), the ITO film 32 is patterned by the photolithography method to form a touch sensor (not shown) and a connection terminal 28. Thus, one end of the lead wire is electrically connected to the touch sensor, and the other end of the lead wire is electrically connected to the connection terminal 28.

As shown in FIG. 5(e), the connection region in which the connection terminals 28 are formed is covered with a metal mask, and the protective film 29 is formed by the sputtering method or a CVD (Chemical Vapor Deposition) method. The protective film 29 is formed so as to cover the entire insulating substrate 21 except for the connection terminals 28. The protective film 29 is, for example, any of a silicon oxide film, a silicon nitride film, and an organic film, or a stacked film made by those films.

In such a manner, the alignment mark 25 in the touch panel 20 is formed by the same opaque metal film as that of the lead wires, and the connection terminals 28 are formed by the transparent metal oxide film. Further, the alignment mark 25 is covered with the protective film 29 together with the lead wire, the touch sensor, and the like. In this case, the touch panel 20 is formed by a manufacturing process which is the same as conventional one only by adding the pattern of the alignment mark 25 to a photo mask used at the time of patterning the aluminum film 31.

1.3 Substrate Module Manufacturing Method

FIGS. 6(a) to 6(d) are process sectional views showing processes of connecting the touch panel 20 and the FPC 50. As shown in FIG. 6(a), the touch panel 20 manufactured by the above-described manufacturing method is prepared. Next, as shown in FIG. 6(b), a rectangular ACF 30 is applied to the touch panel 20 so as to completely cover not only the connection terminals 28 but also the alignment mark 25.

As shown in FIG. 6(c), the FPC 50 is disposed above the touch panel 20, and a camera 55 for mark recognition is installed below the touch panel 20. The position of the FPC 50 is adjusted by moving the FPC 50 to the front, back, right, and left sides or rotating the FPC 50 in a plane so that the alignment mark 25 in the touch panel 20 is housed in the frame of the alignment mark 53 in the FPC 50 (see FIG. 4(b)). Both of the two alignment marks 25 and 53 used for the alignment are formed of opaque metal. It makes the camera 55 for mark recognition recognize the alignment marks 25 and 53 easier, so that alignment can be performed easily and with high precision.

As shown in FIG. 6(d), to thermal-compression-bond the touch panel 20 and the FPC 50 which are aligned, a heater head 56 disposed above the FPC 50 is lowered. Since the heater head 56 is heated, the FPC 50 is lowered by being pushed by the heater head 56 and is thermal-compression-bonded to the touch panel 20. As a result, the wire (connection terminal) 52 in the FPC 50 is electrically connected to the connection terminal 28 in the touch panel 20 via the ACF 30 without misalignment. In addition, since the connection terminal 28 is made only by the ITO film, the reliability of the connection part to the wire (connection terminal) 52 in the FPC 50 can be assured.

1.4 Effect

As described above, the alignment mark 25 in the touch panel 20 is made only by a mark formed by the opaque metal film having high reflection ratio, and reflects light used at the time of alignment well. Since the alignment is performed with the reflection light, visibility of the alignment mark 25 increases, and the position of the alignment mark 25 is detected easily and with high precision. When the alignment mark 25 is used, alignment can be performed easily with high precision. Consequently, the touch panel 20 and the FPC 50 can be electrically connected to each other without causing misalignment. As a result, the yield of the substrate module 40 can be improved. Since visibility of the alignment mark 25 in the touch panel 20 is high, it is unnecessary to modify an alignment apparatus. Therefore, an increase in the manufacturing cost of the substrate module 40 can be suppressed.

Since the connection terminal 28 in the touch panel 20 is formed only by the ITO film, it is not susceptible to corrosion. Consequently, the reliability of the connection part between the touch panel 20 and the FPC 50 can be assured. Further, the alignment mark 25 is formed only by changing a part of the pattern of the photo mask used at the time of the patterning, so that it is unnecessary to add a new manufacturing process or change a conventional manufacturing process.

2. Second to Sixth Embodiments

A configuration of a liquid crystal display device according to second to sixth embodiments to be described below is the same as that of the liquid crystal display device 10 shown in FIG. 1. In addition, the configuration of the substrate module including the touch panel is the same as that of the substrate module 40 shown in FIG. 2. Therefore, in each of the following embodiments, the drawings of the liquid crystal display device and the substrate module and their description will not be repeated. The respective embodiments will be described with reference to enlarged plan views and cross sectional views of parts corresponding to a part (the region surrounded by a dotted line in an ellipse shape) of the touch panel 20 shown in FIG. 2.

2.1 Second Embodiment

FIG. 7(*a*) is an enlarged plan view showing a part of a touch panel 120 included in a liquid crystal display device according to a second embodiment, and FIG. 7(*b*) is a cross sectional view of the touch panel 120 taken along line B-B shown in FIG. 7(*a*). Components different from the components in the touch panel 20 shown in FIGS. 3(*a*) and 3(*b*) in the components in the touch panel 120 shown in FIGS. 7(*a*) and 7(*b*) will be mainly described, the same reference numerals are designated to the same components, and their description will not be repeated.

As shown in FIGS. 7(*a*) and 7(*b*), like the connection terminal 28 in the touch panel 20, the connection terminal 28 in the touch panel 120 is made only by the ITO film, and the connection region 24 including the connection terminal 28 is not covered with the protective film 29. However, an alignment mark 125 in the touch panel 120 is a mark having a stacked structure obtained by a rectangular mark 125*a* made by the same opaque metal film as that of the lead wire 23 and a rectangular mark 125*b* made by a transparent metal oxide film and stacked on the upper surface of the mark 125*a*. The alignment mark 125 is covered with the protective film 29. Thus, since the alignment mark 125 includes the rectangular mark 125*a* formed by the opaque metal film, the visibility of the alignment mark 125 at the time of alignment is high.

FIGS. 8(*a*) to 8(*e*) are process sectional views showing processes of manufacturing the touch panel 120. Manufacturing processes different from the manufacturing processes shown FIGS. 5(*a*) to 5(*e*) in the manufacturing processes shown in FIGS. 8(*a*) to 8(*e*) will be mainly described, the same reference numerals are designated to the same manufacturing processes, and their description will not be repeated.

Figure 5:
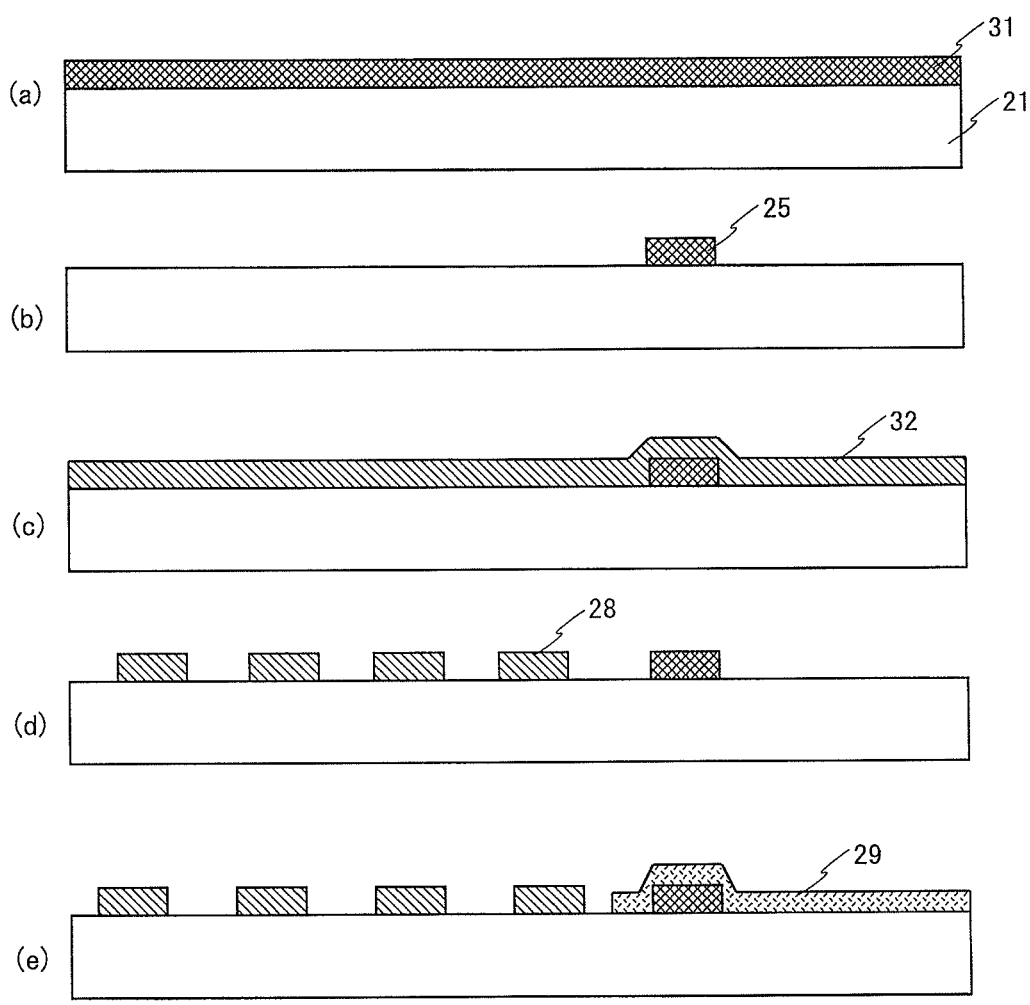
FIGS. 5(a) to 5(e) are process sectional views showing processes of manufacturing the touch panel included in the liquid crystal display device according to the first embodiment.

In a manner similar to the case shown in FIGS. 5(*a*) and 5(*b*), as shown in FIGS. 8(*a*) and 8(*b*), the aluminum film 31 formed on the insulating substrate 21 is patterned to form lead wires (not shown) and the mark 125*a*. Next, as shown in FIG. 8(*c*), the ITO film 32 is formed so as to cover the entire insulating substrate 21.

As shown in FIG. 8(*d*), the ITO film 32 is patterned by a photolithography method to form a touch sensor (not shown) and the connection terminals 28, and the mark 125*b* having the same shape as that of the mark 125*a* is formed also on the upper surface of the mark 125*a* by the ITO film. As a result, the alignment mark 125 having the stacked structure in which the mark 125*b* is stacked on the upper surface of the mark 125*a* is formed. Since the manufacturing process shown in FIG. 8(*e*) is the same as that shown in FIG. 5(*e*), its description will not be repeated. In this case, the alignment mark 125 is formed by the same manufacturing process as the conventional one only by adding the pattern of the alignment mark 125 to each of photo masks used at the time of patterning the aluminum film 31 and the ITO film 32.

Figure 6:
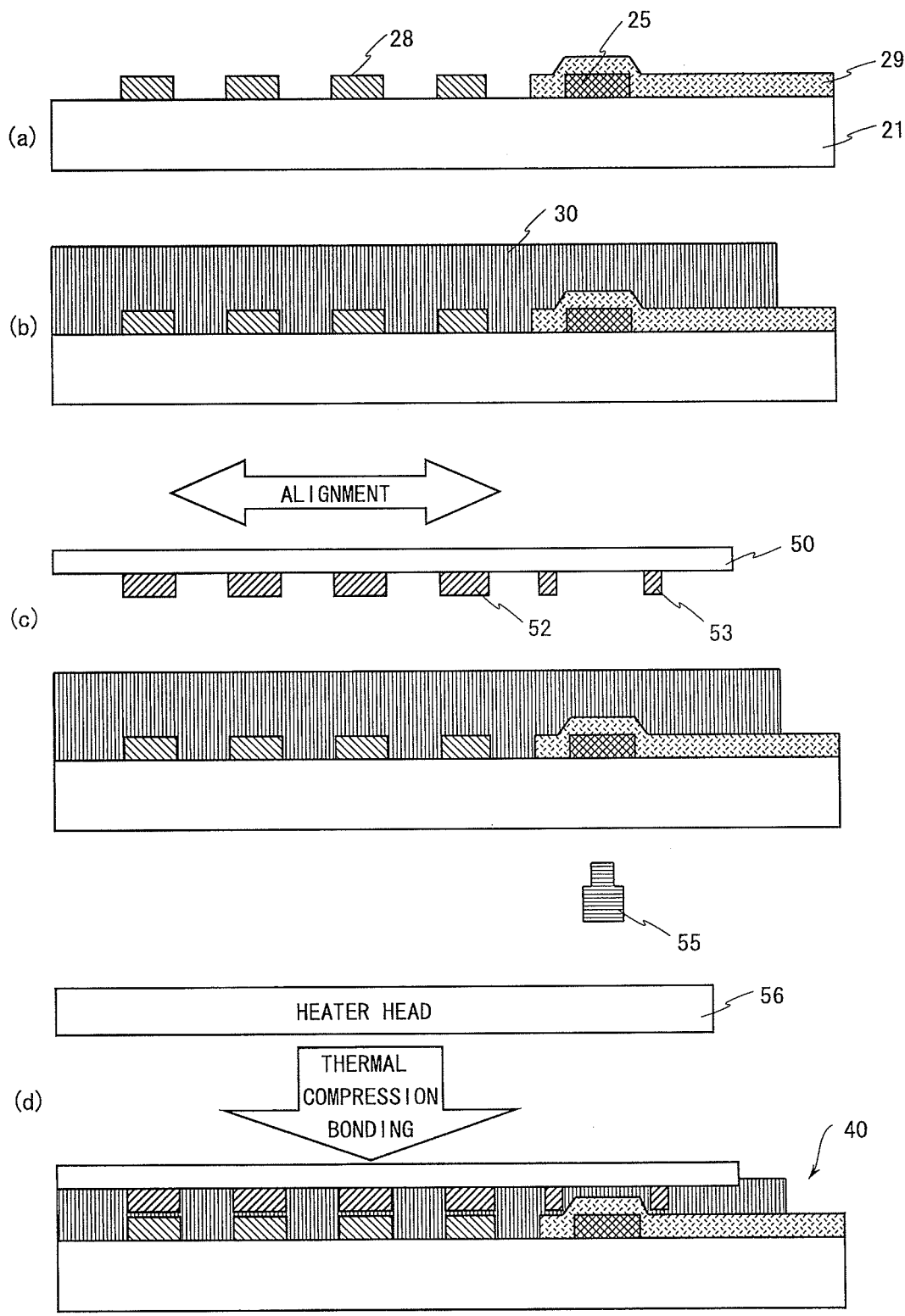
FIGS. 6(a) to 6(d) are process sectional views showing processes of connecting the touch panel included in the liquid crystal display device according to the first embodiment and the FPC.

Since the method of manufacturing a substrate module 140 is the same as that of the substrate module 40 shown in FIG. 6, its description will not be repeated. FIG. 9 is a cross sectional view showing a configuration of the substrate module 140 obtained by thermal-compression-bonding the FPC 50 to the touch panel 120. As shown in FIG. 9, the connection terminal 52 in the FPC 50 is connected to the connection terminal 28 in the touch panel 120 via the ACF 30. In addition, the alignment mark 53 in the FPC 50 is aligned so as to surround the alignment mark 125 in the touch panel 120.

Since the touch panel 120 and the substrate module 140 produce the same effect as that of the touch panel 20 and the substrate module 40 of the first embodiment, the description of the effect will not be repeated.

2.2 Third Embodiment

FIG. 10(*a*) is an enlarged plan view of a part of a touch panel 220 included in a liquid crystal display device according to a third embodiment, and FIG. 10(*b*) is a cross sectional view of the touch panel 220 taken along line C-C shown in FIG. 10(*a*). Components different from the components in the touch panel 120 shown in FIGS. 7(*a*) and 7(*b*) in the components in the touch panel 220 shown in FIGS. 10(*a*) and 10(*b*) will be mainly described, the same reference numerals are designated to the same components, and their description will not be repeated.

Like the connection terminal 28 in the touch panel 120, the connection terminal 28 in the touch panel 220 is formed by the ITO film, and the connection region 24 including the connection terminals 28 is not covered with the protective film 29. However, an alignment mark 225 in the touch panel 220 is a mark having a stacked structure obtained by a rectangular mark 225*b* made by a transparent metal oxide film and a rectangular mark 225*a* made by the same opaque metal film as that of the lead wire 23 and stacked on the upper surface of the mark 225*b*. The alignment mark 225 is covered with the protective film 29. The alignment mark 225 of the third embodiment is a mark obtained by stacking the two marks 125*a* and 125*b* included in the alignment mark 125 of the second embodiment in the opposite order. Thus, since the alignment mark 225 includes the rectangular mark 225*a* formed by the opaque metal film, the visibility of the alignment mark 225 at the time of alignment is high.

Figure 11:
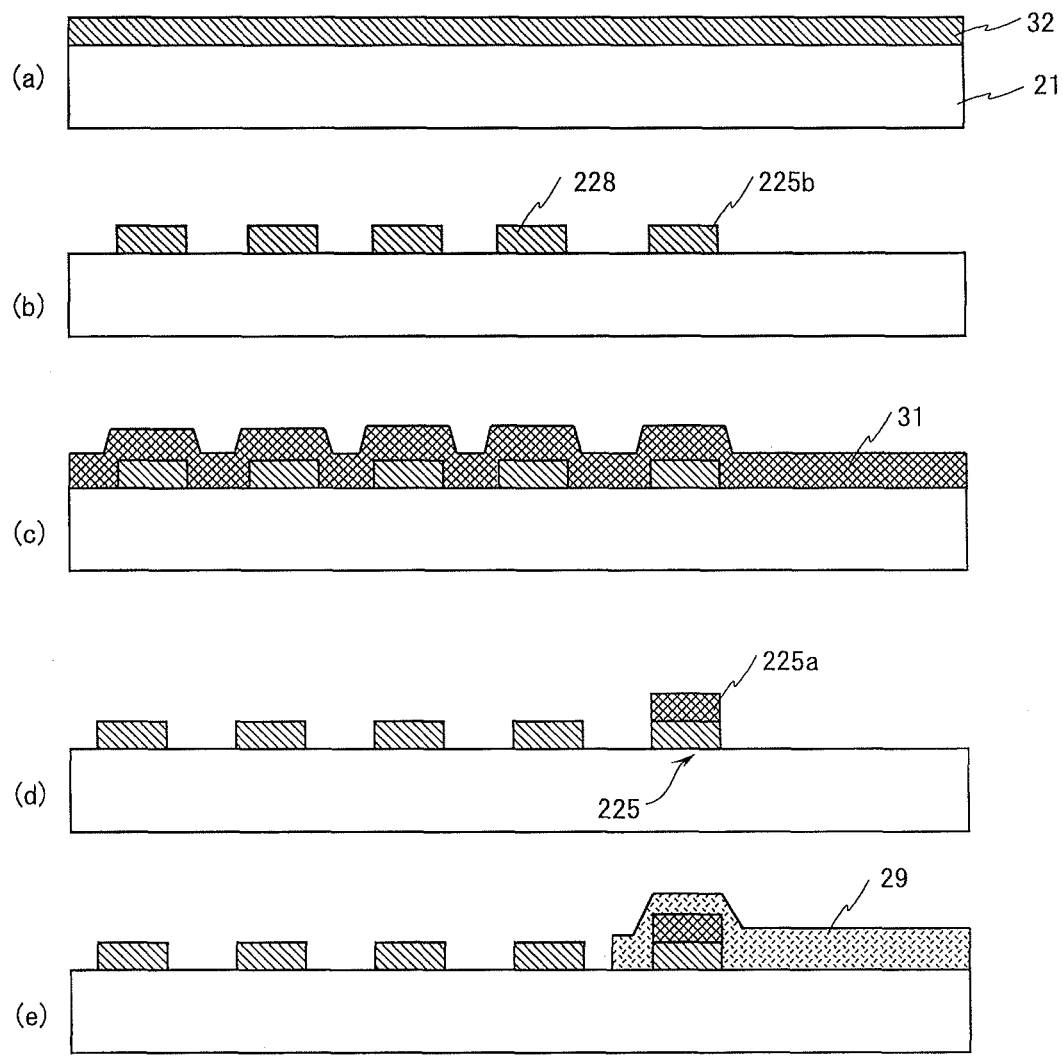
FIGS. 11(a) to 11(e) are process sectional views showing processes of manufacturing the touch panel included in the liquid crystal display device according to the third embodiment.

FIGS. 11(*a*) to 11(*e*) are process sectional views showing processes of manufacturing the touch panel 220. Processes different from the manufacturing processes shown in FIGS. 5(*a*) to 5(*e*) in the manufacturing processes shown in FIGS. 11(*a*) to 11(*e*) will be mainly described, the same reference numerals are designated to the same manufacturing processes, and their description will not be repeated.

As shown in FIG. 11(*a*), first, the ITO film 32 is formed on the insulating substrate 21. Next, as shown in FIG. 11(*b*), by patterning the formed ITO film 32, a touch sensor (not shown), the connection terminals 28 in the connection region, and the mark 225*b* are formed.

As shown in FIG. 11(*c*), the aluminum film 31 is formed so as to cover the entire insulating substrate 21. Next, as shown in FIG. 11(*d*), by patterning the formed aluminum film 31, together with a lead wire (not shown) connecting the touch sensor and the connection terminal 28, the mark 225*a* having the same shape as that of the mark 225*b* is formed on the upper surface of the mark 225*b*. As a result, the alignment mark 225 having the stacked structure in which the mark 225*a* formed by the opaque metal film is stacked on the upper surface of the mark 225*b* formed by the transparent metal oxide film is formed. Since the manufacturing process shown in FIG. 11(*e*)

is the same as that shown in FIG. 5(e), its description will not be repeated. In this case, the alignment mark 225 is formed by the same manufacturing process as the conventional one only by adding the pattern of the alignment mark 225 to each of photo masks used at the time of patterning the aluminum film 31 and the ITO film 32.

Figure 12:
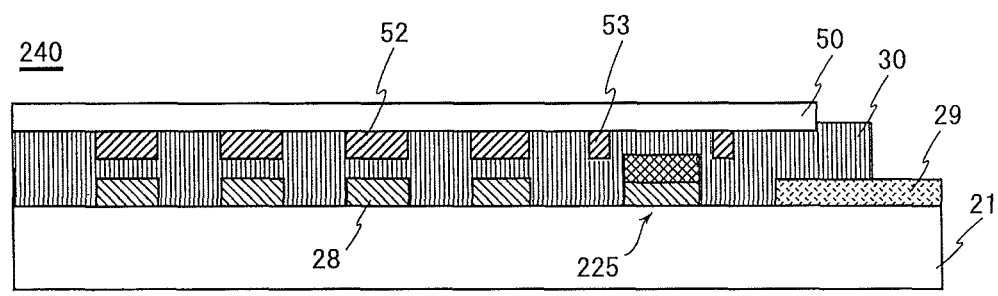
FIG. 12 is a cross sectional view showing the configuration of a substrate module obtained by thermal-compression-bonding an FPC to a touch panel included in the liquid crystal display device according to the third embodiment.

Since the method of manufacturing a substrate module 240 is the same as that of the substrate module 40 shown in FIG. 6, its description will not be repeated. FIG. 12 is a cross sectional view showing the configuration of the substrate module 240 obtained by thermal-compression-bonding the FPC 50 to the touch panel 220. As shown in FIG. 12, the connection terminal 52 in the FPC 50 is connected to the connection terminal 28 in the touch panel 220 via the ACF 30. In addition, the alignment mark 53 in the FPC 50 is aligned so as to surround the alignment mark 225 in the touch panel 220.

Since the touch panel 220 and the substrate module 240 produce the same effect as that of the touch panel 20 and the substrate module 40 of the first embodiment, the description of the effect will not be repeated.

2.3 Fourth Embodiment

Figure 13:
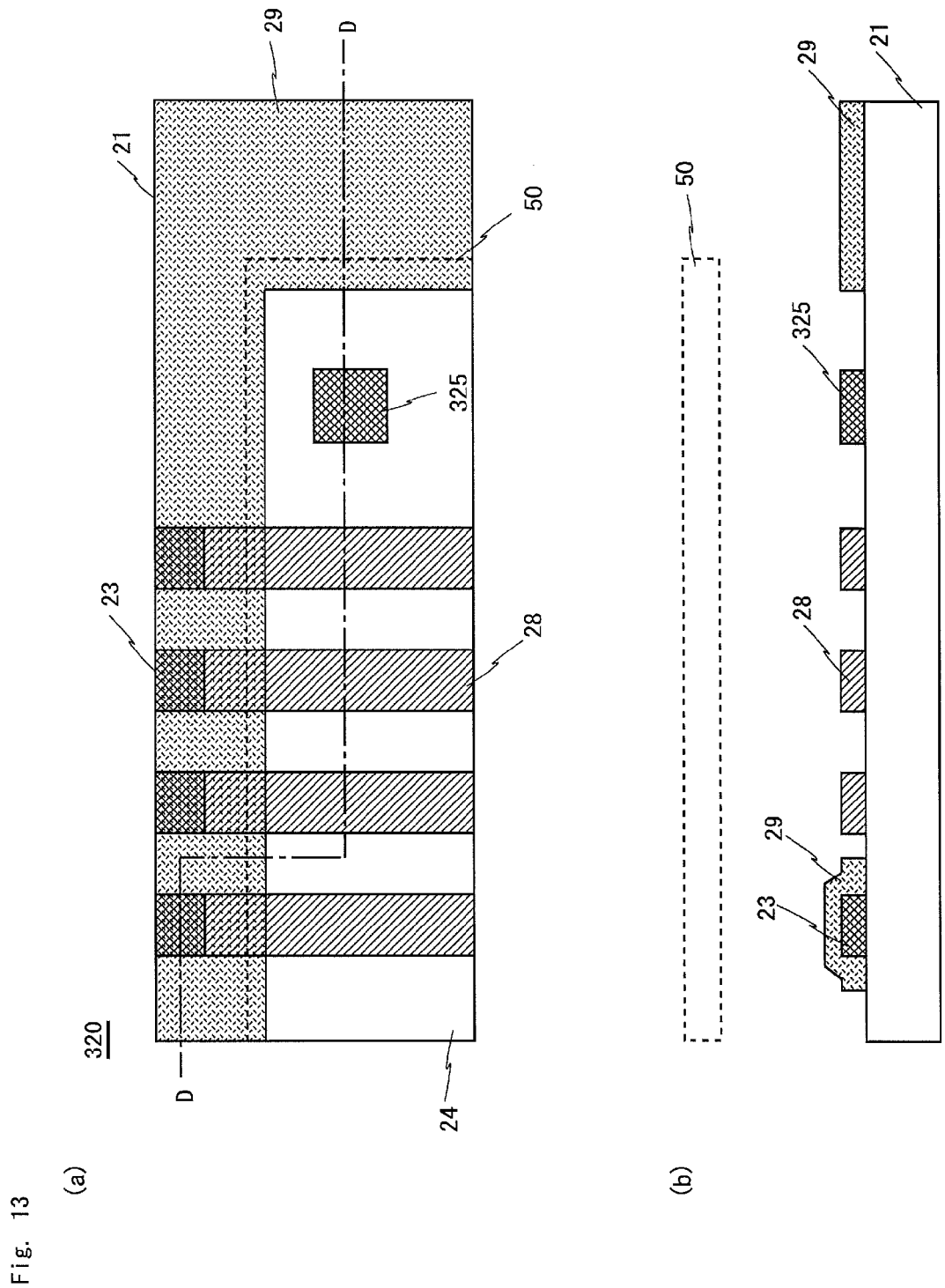
FIG. 13(a) is a plan view showing a part of a touch panel included in a liquid crystal display device according to a fourth embodiment.
FIG. 13(b) is a cross sectional view of the touch panel taken along line D-D shown in FIG. 13(a).

FIG. 13(a) is an enlarged plan view of a part of a touch panel 320 included in a liquid crystal display device according to a fourth embodiment, and FIG. 13(b) is a cross sectional view of the touch panel 320 taken along line D-D shown in FIG. 13(a). Components different from the components in the touch panel 20 shown in FIGS. 3(a) and 3(b) in the components in the touch panel 320 shown in FIGS. 13(a) and 13(b) will be mainly described, the same reference numerals are designated to the same components, and their description will not be repeated.

An alignment mark 325 in the touch panel 320 shown in FIGS. 13(a) and 13(b) is made only by a rectangular mark formed by an opaque metal film like the alignment mark 25 in the touch panel 20 shown in FIGS. 3(a) and 3(b). Thus, since the alignment mark 325 is made only by a rectangular mark formed by an opaque metal film, visibility at the time of alignment is high. However, unlike the alignment mark 25, the alignment mark 325 is not covered with the protective film 29.

Figure 14:
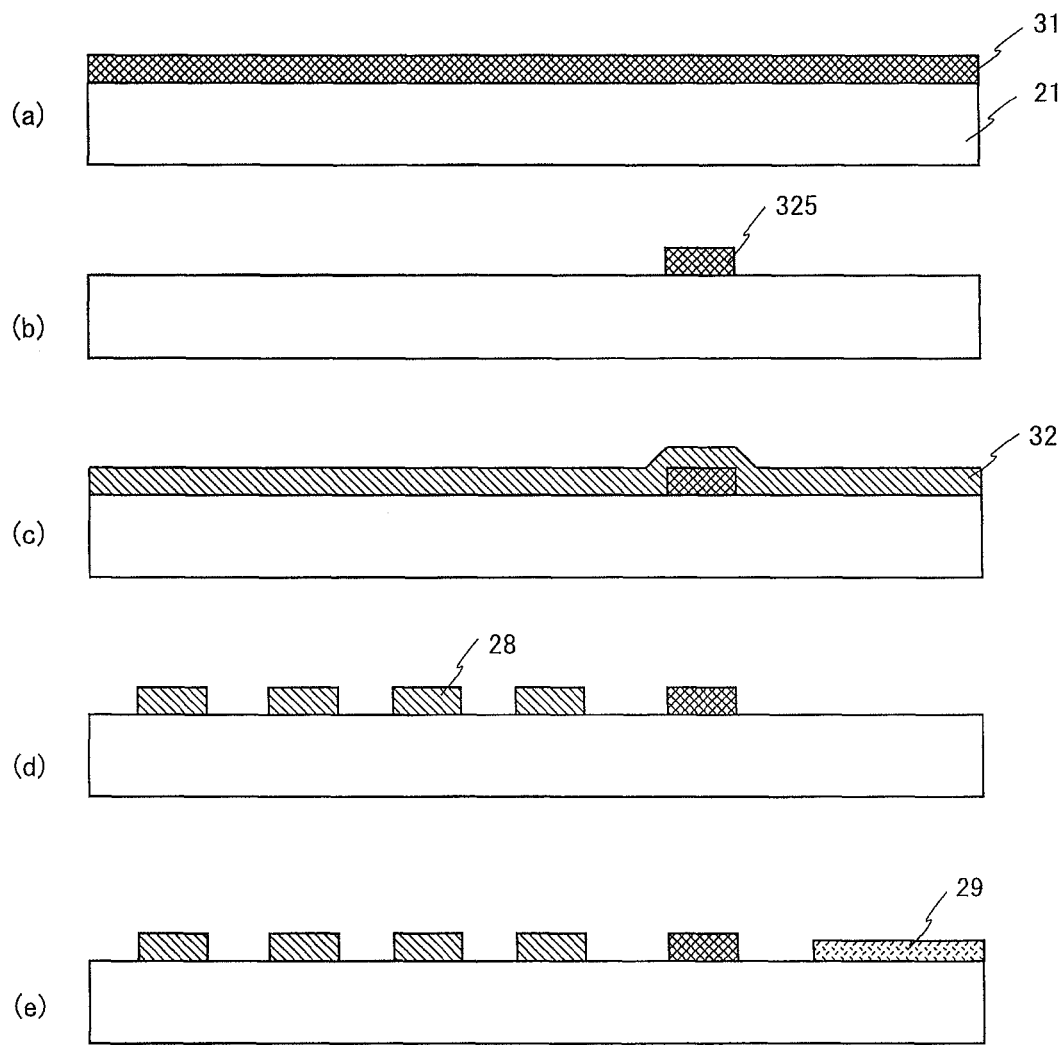
FIGS. 14(a) to 14(e) are process sectional views showing processes of manufacturing the touch panel included in the liquid crystal display device according to the fourth embodiment.

FIGS. 14(a) to 14(e) are process sectional views showing processes of manufacturing the touch panel 320. Since manufacturing processes shown in FIGS. 14(a) to 14(d) are the same as those shown in FIGS. 5(a) to 5(d), their description will not be repeated. In a state where the connection terminals 28 and the alignment mark 325 are covered with a metal mask, the protective film 29 is formed by a CVD method or a sputtering method. Consequently, as shown in FIG. 14(e), not only the connection terminal 28 but also the alignment mark 325 is not covered with the protective film 29. In such a manner, the alignment mark 325 which is a mark having the same structure as that of the alignment mark 25 and whose surface is not covered with the protective film 29 is formed. In this case, the alignment mark 325 is formed by the same manufacturing process as the conventional one only by adding the pattern of the alignment mark 325 to the photo mask used at the time of patterning the aluminum film 31.

Figure 15:
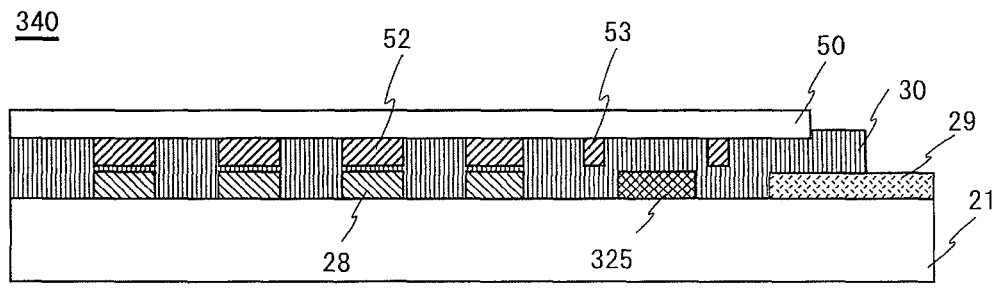
FIG. 15 is a cross sectional view showing the configuration of a substrate module obtained by thermal-compression-bonding an FPC to a touch panel included in the liquid crystal display device according to the fourth embodiment.

Since the method of manufacturing a substrate module 340 is the same as that of the substrate module 40 shown in FIG. 6, its description will not be repeated. FIG. 15 is a cross sectional view showing a configuration of the substrate module 340 obtained by thermal-compression-bonding the FPC 50 to the touch panel 320 through the manufacturing method shown in FIG. 6. The connection terminal 52 in the FPC 50 is connected to the connection terminal 28 in the touch panel 320 via the ACF 30. The alignment mark 53 in the FPC 50 is aligned so as to surround the alignment mark 325 in the touch panel 320.

Since the touch panel 320 and the substrate module 340 produce the same effect as that of the touch panel 20 and the substrate module 40 of the first embodiment, the description of the effect will not be repeated. Note that, since the opaque metal film included in the alignment mark 325 is not covered with the protective film 29, it is susceptible to corrosion due to moisture in atmosphere. However, since the role of the alignment mark 325 in the touch panel 320 ends after aligning and thermal-compression-bonding the FPC 50, even if the film is corroded after that, there is no problem.

2.4 Fifth Embodiment

FIG. 16(a) is an enlarged plan view of a part of a touch panel 420 included in a liquid crystal display device according to a fifth embodiment, and FIG. 16(b) is a cross sectional view of the touch panel 420 taken along line E-E shown in FIG. 16(a). Components different from the components in the touch panel 120 shown in FIGS. 7(a) and 7(b) in the components in the touch panel 420 shown in FIGS. 16(a) and 16(b) will be mainly described, the same reference numerals are designated to the same components, and their description will not be repeated.

Like the alignment mark 125 shown in FIGS. 7(a) and 7(b), an alignment mark 425 in the touch panel 420 is a mark having a stacked structure obtained by a rectangular mark 425a made by the opaque metal film and a rectangular mark 425b made by an ITO film and stacked on the upper surface of the mark 425a. Thus, since the alignment mark 425 includes the rectangular mark 425a formed by the opaque metal film, the visibility of the alignment mark 425 at the time of alignment is high. However, unlike the alignment mark 125, the alignment mark 425 is not covered with the protective film 29.

Figure 17:
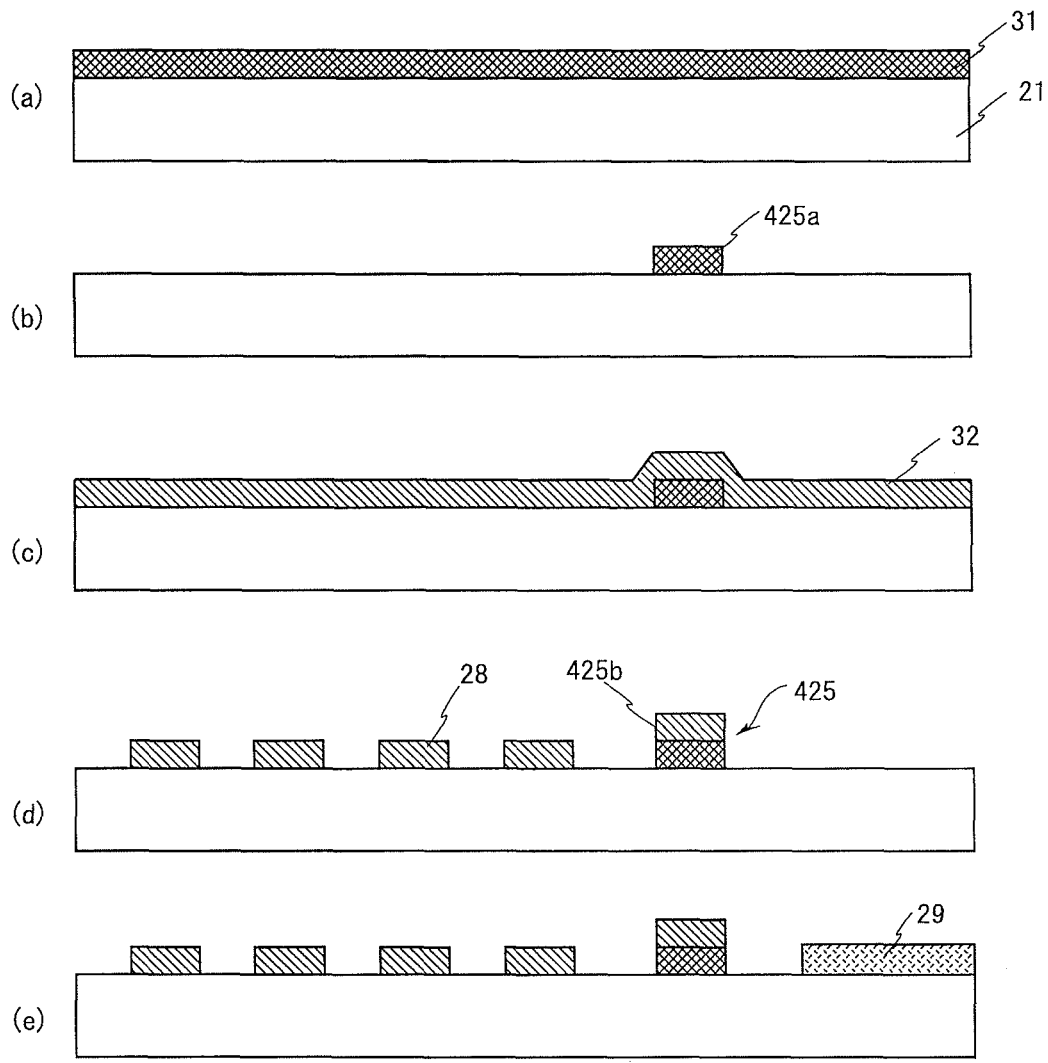
FIGS. 17(a) to 17(e) are process sectional views showing processes of manufacturing the touch panel included in the liquid crystal display device according to the fifth embodiment.

FIGS. 17(a) to 17(e) are process sectional views showing processes of manufacturing the touch panel 420. Since manufacturing processes shown in FIGS. 17(a) to 17(d) are the same as those shown in FIGS. 8(a) to 8(d), their description will not be repeated. As shown in FIG. 17(e), in a state where the connection terminals 28 and the alignment mark 425 are covered with a metal mask, the protective film 29 is formed by a CVD method or a sputtering method. Consequently, not only the connection terminal 28 but also the alignment mark 425 is not covered with the protective film 29. In such a manner, the alignment mark 425 which is a mark having the same stacked structure as that of the alignment mark 125 and whose surface is not covered with the protective film 29 is formed. In this case, the alignment mark 425 is formed by the same manufacturing process as the conventional one only by adding the pattern of the alignment mark 425 to each of the photo masks used at the time of patterning the aluminum film 31 and the ITO film 32.

Figure 18:
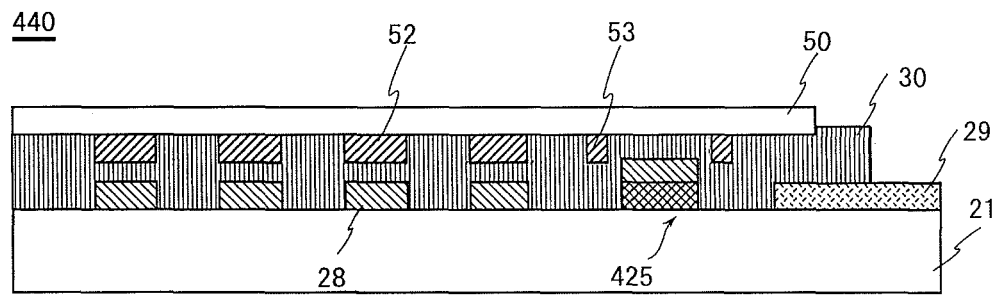
FIG. 18 is a cross sectional view showing the configuration of a substrate module obtained by thermal-compression-bonding an FPC to a touch panel included in the liquid crystal display device according to the fifth embodiment.

Since the method of manufacturing a substrate module 440 is the same as that of the substrate module 40 shown in FIG. 6, its description will not be repeated. FIG. 18 is a cross sectional view showing a configuration of the substrate module 440 obtained by thermal-compression-bonding the FPC 50 to the touch panel 420 through the manufacturing method shown in FIG. 6. The connection terminal 52 in the FPC 50 is connected to the connection terminal 28 in the touch panel 420 via the ACF 30. The alignment mark 53 in the FPC 50 is aligned so as to surround the alignment mark 425 in the touch panel 420.

Since the touch panel 420 and the substrate module 440 produce the same effect as that of the touch panel 20 and the substrate module 40 of the first embodiment, the description of the effect will not be repeated. Note that, since the problem of corrosion of the opaque metal film caused by the fact that the alignment mark 425 is not covered with the protective film 29 is the same as that in the case of the touch panel 320 shown in FIGS. 13(a) and 13(b), its description will not be repeated.

2.5 Sixth Embodiment

Figure 19:
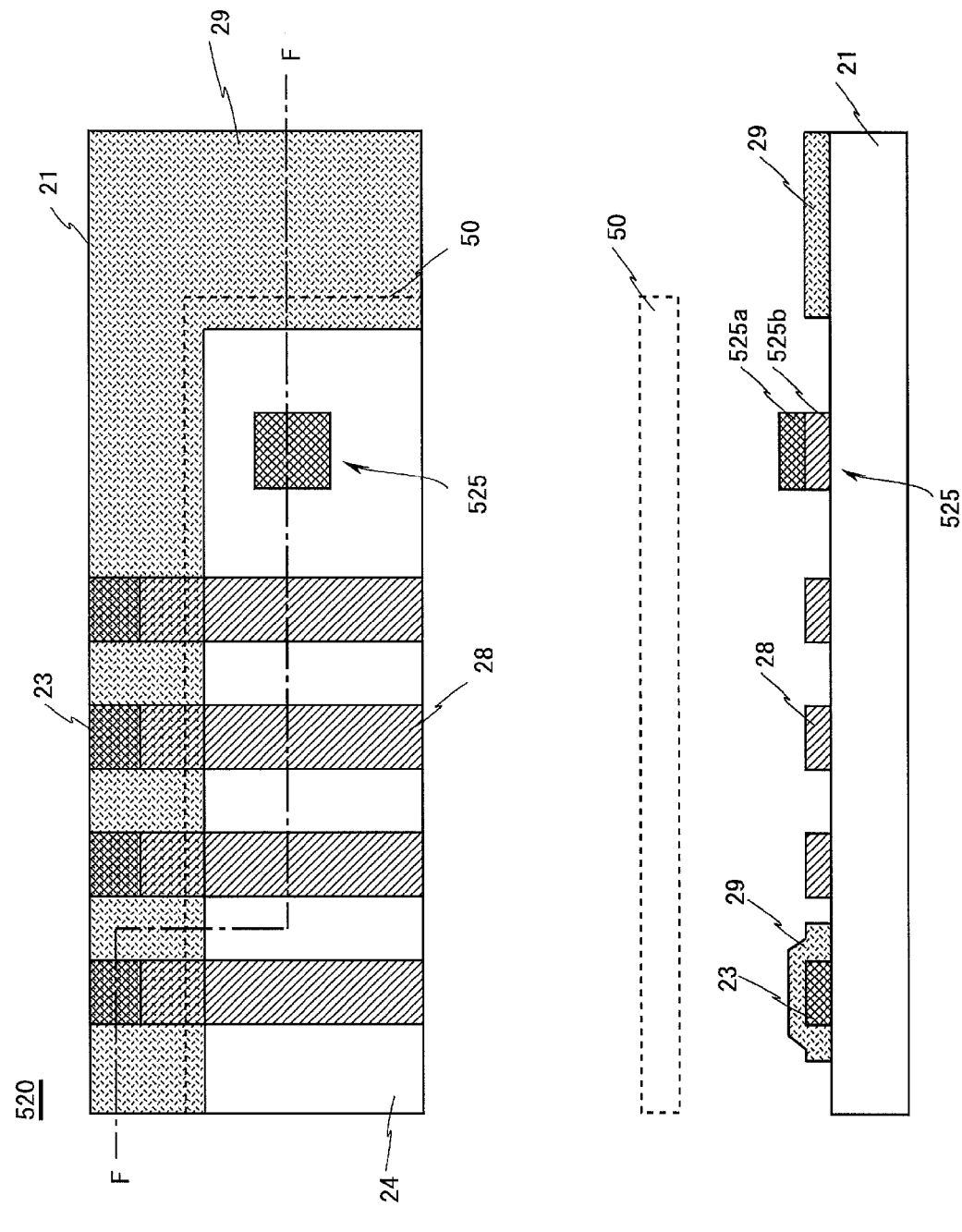
FIG. 19(a) is a plan view showing a part of a touch panel included in a liquid crystal display device according to a sixth embodiment.
FIG. 19(b) is across sectional view of the touch panel taken along line F-F shown in FIG. 19(a).

FIG. 19(a) is an enlarged plan view of a part of a touch panel 520 included in a liquid crystal display device according to a sixth embodiment, and FIG. 19(b) is a cross sectional view of the touch panel 520 taken along line F-F shown in FIG. 19(a). Components different from the components in the touch panel 220 shown in FIGS. 10(a) and 10(b) in the components in the touch panel 520 shown in FIGS. 19(a) and 19(b) will be mainly described, the same reference numerals are designated to the same components, and their description will not be repeated.

Like the alignment mark 225 shown in FIGS. 10(a) and 10(b), an alignment mark 525 in the touch panel 520 is a mark having a stacked structure obtained by a rectangular mark 525b made by a transparent metal oxide film and a rectangular mark 525a made by an opaque metal film and stacked on the upper surface of the mark 525b. Thus, since the alignment mark 525 includes the rectangular mark 525a formed by the opaque metal film, the visibility of the alignment mark 525 at the time of alignment is high. However, unlike the alignment mark 225, the alignment mark 525 is not covered with the protective film 29.

Figure 20:
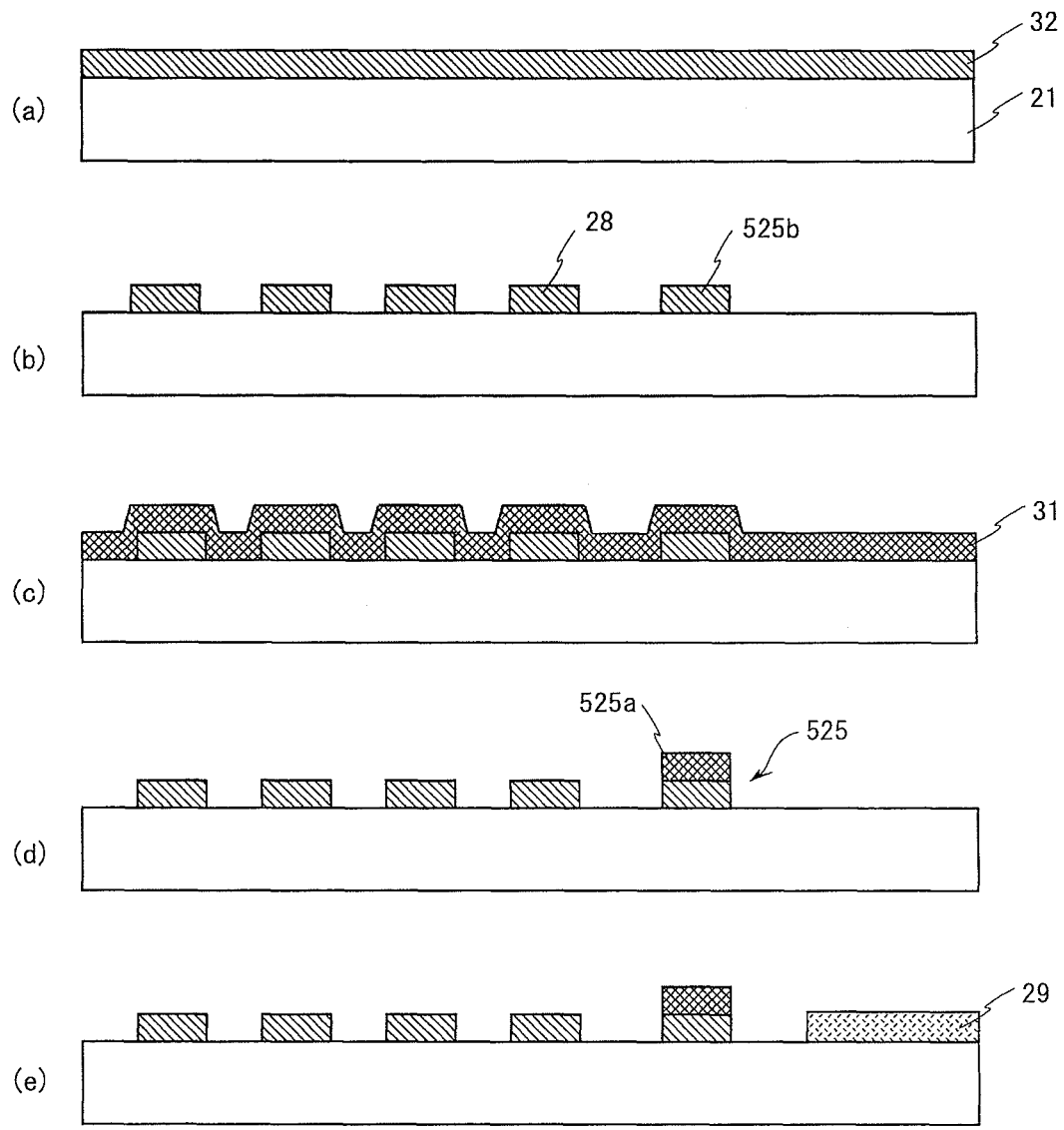
FIGS. 20(a) to 20(e) are process sectional views showing processes of manufacturing the touch panel included in the liquid crystal display device according to the sixth embodiment.

FIGS. 20(a) to 20(e) are process sectional views showing processes of manufacturing the touch panel 520. Since the manufacturing processes shown in FIGS. 20(a) to 20(d) are the same as those shown in FIGS. 11(a) to 11(d), their description will not be repeated. In a state where the connection terminals 28 and the alignment mark 525 are covered with a metal mask, the protective film 29 is formed by a CVD method or a sputtering method. Consequently, as shown in FIG. 20(e), not only the connection terminal 28 but also the alignment mark 525 is not covered with the protective film 29. In such a manner, the alignment mark 525 which is a mark having the same stacked structure as that of the alignment mark 225 and whose surface is not covered with the protective film 29 is formed. In this case, the alignment mark 525 is formed by the same manufacturing process as the conventional one only by adding the pattern of the alignment mark 525 to each of photo masks used at the time of patterning the aluminum film 31 and the ITO film 32.

Figure 21:
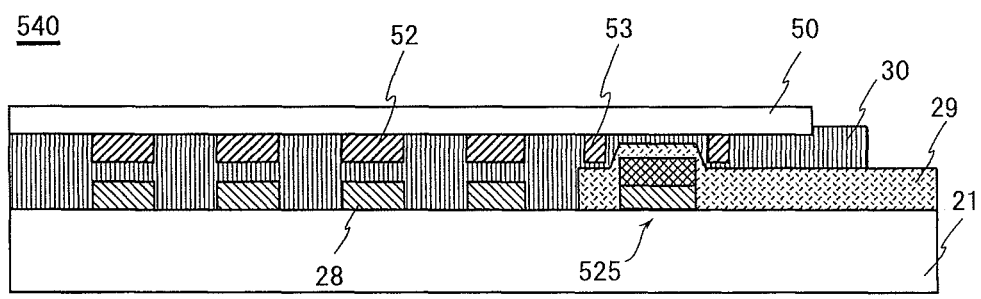
FIG. 21 is a cross sectional view showing the configuration of a substrate module obtained by thermal-compression-bonding an FPC to a touch panel included in the liquid crystal display device according to the sixth embodiment.

Since the method of manufacturing a substrate module 540 is the same as that of the substrate module 40 shown in FIG. 6, its description will not be repeated. FIG. 21 is a cross sectional view showing a configuration of the substrate module 540 obtained by thermal-compression-bonding the FPC 50 to the touch panel 520 through the manufacturing method shown in FIG. 6. The connection terminal 52 in the FPC 50 is connected to the connection terminal 28 in the touch panel 520 via the ACF 30. The alignment mark 53 in the FPC 50 is aligned so as to surround the alignment mark 525 in the touch panel 520.

Since the touch panel 520 and the substrate module 540 produce the same effect as that of the touch panel 20 and the substrate module 40 of the first embodiment, the description of the effect will not be repeated. Note that, since the problem of corrosion of the opaque metal film due to the fact that the alignment mark 525 is not covered with the protective film 29 is the same as that in the case of the touch panel 320 shown in FIGS. 13(a) and 13(b), its description will not be repeated.

3. Others

Although it has been described that the touch panel is a touch panel of a capacitive coupling type in the foregoing embodiments, a touch panel of a resistance film type, an infrared type, an ultrasonic type, or an electromagnetic coupling type may be used. The insulating substrate 21 of the touch panel may be also used as the opposed substrate 72 of the liquid crystal panel 70. In this case, the touch sensor is formed on the other surface opposed to the surface which is in contact with the liquid crystal layer 73 of the opposed substrate 72.

In the foregoing embodiments, the case where the touch panel and the FPC 50 are electrically connected has been described. The present invention, however, is not limited to the touch panel but may relate to a circuit board having a connection terminal which is electrically connected to the FPC 50. In particular, in the liquid crystal display device 10, the present invention can be also applied to the case of electrically connecting the FPC 50 to the active matrix substrate 71 as a component in the liquid crystal panel 70 in a manner similar to the case of electrically connecting the FPC 50 to the touch panel in each of the embodiments.

In the foregoing embodiments, the FPC 50 is electrically connected to the connection region 24 in the touch panel to which the ACF 30 is applied as an anisotropic conductive adhesive material. Alternatively, in place of the ACF 30, an anisotropic conductive paste may be applied on the connection region 24 in the touch panel.

Although it has been described that the touch panel is included in the liquid crystal display device 10 in the foregoing embodiments, the touch panel may be included in an organic EL (Electro Luminescence) display device.

In the second, third, fifth, and sixth embodiments, it has been described that the shape of the mark made by the transparent metal oxide film included in the alignment mark in the touch panel is the same as that of the mark made by the opaque metal film. However, the mark made by the opaque metal film may be larger or smaller than the mark made by the transparent metal oxide film. In any case, the visibility at the time of alignment of the alignment mark is high, so that the effect similar to that of the alignment mark of the embodiments is produced.

The connection terminal 28, the touch sensor 22, and the marks 125b, 225b, 425b, and 525b as the second mark in the alignment mark in each of the touch panels may be formed by a transparent conductive film in place of the transparent metal oxide film. Further, the lead wire 23 and the marks 125a, 225a, 425a, and 525a as the first mark in the alignment mark in each of the touch panels may be formed by an opaque conductive film in place of the opaque metal.

The present invention is suited for a circuit board on which an alignment mark for connection to a flexible printed circuit is formed and, particularly, in a display device such as a liquid crystal display device, the present invention is suited for the case of electrically connecting a flexible printed circuit to an active matrix substrate as a component in a display panel.

The invention claimed is:
1. A circuit board having an insulating substrate, comprising:
   a connection terminal formed on the insulating substrate and used for electric connection to a flexible printed circuit; and a first alignment mark used for alignment to the flexible printed circuit, wherein the connection terminal is formed by a transparent conductive film, the first alignment mark includes a first mark formed by an opaque conductive film and a second mark formed by a transparent conductive film, and the second mark is formed on the upper surface of the first mark.

2. The circuit board according to claim 1, wherein the first alignment mark is covered with a protective film.

3. The circuit board according to claim 1, wherein the connection terminal in the circuit board is formed only by a transparent conductive film.

4. A circuit board having an insulating substrate, comprising:

a connection terminal formed on the insulating substrate and used for electric connection to a flexible printed circuit; and a first alignment mark used for alignment to the flexible printed circuit, wherein the connection terminal is formed by a transparent conductive film, the first alignment mark includes a first mark formed by an opaque conductive film and a second mark formed by a transparent conductive film, and the first mark is formed on the upper surface of the second mark.

5. The circuit board according to claim 4, wherein the first alignment mark is covered with a protective film.

6. The circuit board according to claim 4, wherein the connection terminal in the circuit board is formed only by a transparent conductive film.

7. A circuit board having an insulating substrate, comprising:

a connection terminal formed on the insulating substrate and used for electric connection to a flexible printed circuit, a first alignment mark used for alignment to the flexible printed circuit; and a first wire electrically connected to the connection terminal and formed by the opaque conductive film, wherein the connection terminal is formed by a transparent conductive film, and the first alignment mark includes a first mark formed by an opaque conductive film made of the same material as that of the first wire.

8. The circuit board according to claim 7, wherein the first alignment mark is covered with a protective film.

9. The circuit board according to claim 7, wherein the connection terminal in the circuit board is formed only by a transparent conductive film.

10. A substrate module having a circuit board according to claim 1 and a flexible printed circuit electrically connected to the circuit board, wherein the flexible printed circuit includes:

a flexible substrate;

a second wire formed on the flexible substrate; and a second alignment mark formed near the second wire, and a connection terminal in the circuit board is electrically connected to the second wire aligned by using a first alignment mark in the circuit board and the second alignment mark in the flexible printed circuit.

11. A display device having a circuit board according to claim 1 and a display panel for displaying an image, wherein the circuit board is a touch panel formed by a transparent conductive film and further including a touch sensor for detecting a touched position, and the display panel is disposed so as to face the touch panel.

12. A substrate module having a circuit board according to claim 4 and a flexible printed circuit electrically connected to the circuit board, wherein the flexible printed circuit includes:

a flexible substrate;

a second wire formed on the flexible substrate; and a second alignment mark formed near the second wire, and a connection terminal in the circuit board is electrically connected to the second wire aligned by using a first alignment mark in the circuit board and the second alignment mark in the flexible printed circuit.

13. A display device having a circuit board according to claim 4 and a display panel for displaying an image, wherein the circuit board is a touch panel formed by a transparent conductive film and further including a touch sensor for detecting a touched position, and the display panel is disposed so as to face the touch panel.

14. A substrate module having a circuit board according to claim 7 and a flexible printed circuit electrically connected to the circuit board, wherein the flexible printed circuit includes:

a flexible substrate;

a second wire formed on the flexible substrate; and a second alignment mark formed near the second wire, and a connection terminal in the circuit board is electrically connected to the second wire aligned by using a first alignment mark in the circuit board and the second alignment mark in the flexible printed circuit.

15. A display device having a circuit board according to claim 7 and a display panel for displaying an image, wherein the circuit board is a touch panel formed by a transparent conductive film and further including a touch sensor for detecting a touched position, and the display panel is disposed so as to face the touch panel.

* * * * *